United States Patent
Button et al.

(10) Patent No.: US 10,381,994 B2
(45) Date of Patent: Aug. 13, 2019

(54) CONSTRAINED NONLINEAR PARAMETER ESTIMATION FOR ROBUST NONLINEAR LOUDSPEAKER MODELING FOR THE PURPOSE OF SMART LIMITING

(71) Applicant: HARMAN INTERNATIONAL INDUSTRIES, INCORPORATED, Stamford, CT (US)

(72) Inventors: Douglas J. Button, Simi Valley, CA (US); Russell H. Lambert, Highland, UT (US)

(73) Assignee: Harman International Industries, Incorporated, Stamford, CT (US)

( * ) Notice: Subject to any disclaimer, the term of this patent is extended or adjusted under 35 U.S.C. 154(b) by 0 days.

(21) Appl. No.: 15/850,961

(22) Filed: Dec. 21, 2017

(65) Prior Publication Data

US 2019/0199307 A1    Jun. 27, 2019

(51) Int. Cl.
| | |
|---|---|
| H04R 29/00 | (2006.01) |
| H03G 1/04 | (2006.01) |
| H04R 3/00 | (2006.01) |
| H03G 1/00 | (2006.01) |
| H04R 9/02 | (2006.01) |

(52) U.S. Cl.
CPC ............ H03G 1/04 (2013.01); H03G 1/0005 (2013.01); H04R 3/007 (2013.01); H04R 9/025 (2013.01); H04R 29/003 (2013.01)

(58) Field of Classification Search
CPC ... H04R 3/00; H04R 3/02; H04R 3/04; H04R 3/007; H04R 29/00; H04R 29/001; H04R 29/003; H04R 9/025; H03F 1/52; H03F 1/30; H03F 2200/331; H03F 2200/03; H03G 11/00; H03G 11/008; H03G 11/02; H03G 11/04; H03G 1/04; H03G 1/0005;
(Continued)

(56) References Cited

U.S. PATENT DOCUMENTS

| 6,163,613 A | 12/2000 | Cowans |
| 7,447,318 B2 | 11/2008 | Button et al. |

(Continued)

FOREIGN PATENT DOCUMENTS

| EP | 2642769 A1 | 9/2013 |
| WO | 2016124896 A1 | 8/2016 |

(Continued)

OTHER PUBLICATIONS

Iyer, Button and Lambert, "Power Considerations for Distortion Reduction of Loudspeakers," AES 141st Convention, Los Angeles, USA, Sep. 29-Oct. 2, 2016, 10 pages.

Klippel, Wolfgang, "Measurement of Large-Signal Parameters of Electrodynamic Transducer," AES 107th Convention, New York, Sep. 24-27, 1999, 22 pages.

(Continued)

Primary Examiner — Leshui Zhang
(74) Attorney, Agent, or Firm — Brooks Kushman, P.C.

(57) ABSTRACT

A loudspeaker real-time state variable prediction system may include a loudspeaker having a voice coil and a magnet, and a non-linear excursion model configured to estimate non-linear excursion of the loudspeaker. The system may further include a thermal model configured to utilize thermal parameters and frequency based on at least one thermal property of the loudspeaker, and a gain adjustment thermal limiter configured to apply a gain reduction an incoming audio signal to protect the loudspeaker from thermal overload.

13 Claims, 18 Drawing Sheets

(58) Field of Classification Search
CPC ...... H03G 1/0035; H03G 1/0041; H03G 3/00;
H03G 3/20; H04S 7/301
USPC ......... 381/55, 56, 57, 58, 59, 60, 94.9, 94.8,
381/94.1, 28, 61, 119, 120, 121, 10, 3,
381/102, 101, 100, 99, 93, 83, 71.14,
381/71.12, 71.11, 71.1, 317, 318, 320;
700/94
See application file for complete search history.

(56) References Cited

U.S. PATENT DOCUMENTS

| | | | |
|---|---|---|---|
| 2002/0118841 A1* | 8/2002 | Button | H04R 3/00 381/55 |
| 2009/0257599 A1 | 10/2009 | Sand Jensen et al. | |
| 2011/0228945 A1 | 9/2011 | Mihelich et al. | |
| 2012/0300949 A1* | 11/2012 | Rauhala | H04R 3/007 381/55 |
| 2013/0022207 A1* | 1/2013 | Luo | H03G 9/005 381/55 |
| 2015/0304772 A1* | 10/2015 | Risberg | H04R 3/007 381/55 |
| 2015/0319529 A1 | 11/2015 | Klippel | |
| 2016/0157035 A1* | 6/2016 | Russell | H04R 7/16 381/405 |
| 2016/0373871 A1 | 12/2016 | Ronig et al. | |
| 2017/0105068 A1 | 4/2017 | Lesso | |
| 2017/0347188 A1 | 11/2017 | Thyssen | |

FOREIGN PATENT DOCUMENTS

| | | |
|---|---|---|
| WO | 2016124897 A1 | 8/2016 |
| WO | 2016155853 A1 | 10/2016 |

OTHER PUBLICATIONS

Klippel, Wolfgang, "Nonlinear Large-Signal Behavior of Electro-dynamic Loudspeakers at Low Frequencies," J. Audio Eng. Soc., vol. 40, No. 6, Jun. 1992, 14 pages.

Button, Douglas, "Heat Dissipation and Power Compression in Loudspeakers," J. Audio Eng. Soc., vol. 40, No. 1/2, Jan./Feb. 1992, 10 pages.

Andersen, Martin Rune, "Compensation of Nonlinearities in Transducers," Technical University of Denmark, Informatics and Mathematical Modelling, IMM-THESIS: ISSN 1601-233X, (May 25, 2005), 103 pages.

Klippel, Wolfgang, "Loudspeaker Nonlinearities—Causes, Parameters, Symptoms," (2006), 69 pages.

Agerkvist, Finn T., "Modelling Loudspeaker Non-Linearities", Proceedings of the AES 32nd International Conference, Hillerod, Denmark, Sep. 21-23, 2007, 10 pages.

Klippel, Wolfgang, "Nonlinear Modeling of the Heat Transfer in Loudspeakers", J. Audio Eng. Soc., vol. 52, No. 1/2, Jan./Feb. 2004, 23 pages.

Klippel, Wolfgang, "Optimal Design of Loudspeakers with Nonlinear Control", Proceedings of the AES 32nd International Conference, Hillerod, Denmark, Sep. 21-23, 2007, 11 pages.

Toverland, Johan, "Thermal modelling of voice coils in microspeakers", Masters of Science Thesis in Electrical Engineering, Department of Electrical Engineering, Linköping University, 2016, 64 pages. URL:https://liu.diva-portal.org/smash/get/diva2:954210/FULLTEXT01.pdf.

Unknown, "How to do extrapolation of a curve?", MATLAB Answers, Dec. 4, 2004, 7 pages. URL:https://www.athworks.com/matlabcentral/answers/165468-how-to-do-extrapolation-of-a-curve.

Voishvillo, Alexander, "Application of Static and Dynamic Magnetic Finite Element Analysis to the Design and Optimization of Moving Coil Transducer Motors", AES 135th Convention, New York, NY, USA Oct. 17-20, 2013, 13 pages.

* cited by examiner in a noncoupled two-way
CONSTRAINED NONLINEAR PARAMETER ESTIMATION FOR ROBUST NONLINEAR LOUDSPEAKER MODELING FOR THE PURPOSE OF SMART LIMITING

TECHNICAL FIELD

Disclosed herein are systems for loudspeaker real-time state variable predictions with limiting and linear compensation.

BACKGROUND

Various methods and systems have been developed to protect loudspeakers with digital signal processing (DSP). Various models have been developed to characterized the non-linearities of loudspeakers. The main sources of these nonlinearities are Force Factor $B_l(x)$, stiffness $K_{ms}(x)$, and Inductance $L_e(x)$. Existing speaker limiters may limit peak or RMS voltages, but lack the proper information, including complete thermal and excursion models. These speaker limiters may be overly cautious in limiting and thereby prevent the loudspeaker from performing at the maximum output that it is capable of.

SUMMARY

A loudspeaker parameter prediction system may include a loudspeaker having a voice coil and a magnet, and a non-linear excursion model configured to estimate non-linear excursion of the loudspeaker. The system may further include an excursion limiter configured to receive the predicted displacement signal from the nonlinear model to prevent over excursion at all drive levels, and a thermal model. The thermal model may be configured to utilize frequency dependent parameters and frequency independent parameters based on at least one thermal property of the loudspeaker, and receive an audio signal from after the excursion limiter has been engaged to determine real-time temperature of the loudspeaker and impedance. The system may further include a gain adjustment thermal limiter configured to apply a gain reduction to the incoming audio signal based on the real-time temperature of the loudspeaker to protect the loudspeaker from thermal overload.

A loudspeaker real-time state variable prediction system may include a loudspeaker having a voice coil and a magnet, and a non-linear excursion model configured to estimate non-linear excursion of the loudspeaker. The system may further include a thermal model configured to utilize thermal parameters that are frequency dependent on at least one thermal property of the loudspeaker, and a gain adjustment thermal limiter configured to apply a gain reduction an incoming audio signal to protect the loudspeaker from thermal overload.

BRIEF DESCRIPTION OF THE DRAWINGS

The embodiments of the present disclosure are pointed out with particularity in the appended claims. However, other features of the various embodiments will become more apparent and will be best understood by referring to the following detailed description in conjunction with the accompanying drawings in which:

DETAILED DESCRIPTION

Figure 1:
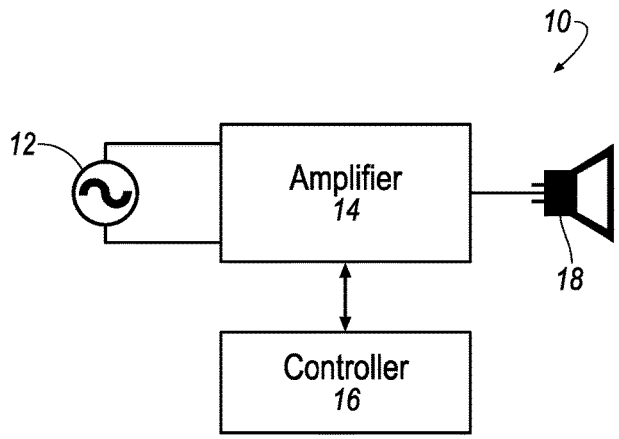
FIG. 1 illustrates an example speaker system.

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

An electromagnetic loudspeaker may use magnets to produce magnetic flux in an air gap. A voice coil may be placed in the air gap. The voice coil may have cylindrically wound conductors. An audio amplifier is electrically connected to the voice coil to provide electrical signal that corresponds to a particular current to the voice coil. The electrical signal and the magnetic field produced by the magnets cause the voice coil to oscillate, and in turn, drive a diaphragm to produce sound.

However, loudspeakers have limits to their performance. Typically, as more power is applied to the speaker, the voice coil will heat up and eventually fail. This is due to the resistance of the conductors generating heat. As the DC resistance (DCR) of the voice coil makes up a major portion of a driver's impedance, most of the input power is converted into heat rather than sound. Thus, as the temperature of the coil increases, the DCR of the coil will increase. The power handling capacity of a driver is limited by its ability to tolerate heat. Further, the resistance and impedance of the loudspeaker increases as the voice coil temperature increases. This may lead to power compression, a frequency dependent loss of expected output due to the rise in temperature of the voice coil and the DCR. As the DCR increases, the linear and nonlinear behavior of the system changes. As more low frequencies are applied to a driver, greater cone excursion is recognized. Loudspeakers have a finite amount of excursion capability before extreme distortion of the output occurs. In order to compensate for these changes, adjustments may be necessary. In order to apply the appropriate adjustments, accurate prediction of the voice coil temperature and nonlinear behavior of the cone excursion in real-time or near real-time may be necessary. Such predictions may allow the cone to reach a safe maximum excursion, and properly control over-excursion without creating undo distortion.

To achieve an accurate model of the voice coil temperature and the nonlinear behavior of the cone excursion, the system includes both a thermal modeling system and a nonlinear modeling system. The model may accurately predict various state variables of cone excursion and voice coil temperature in real time in order to property apply limiting and power compression compensation.

The thermal operating system may permit linear compensation in the form of a parametric equalization to compensate for power compression based on knowledge of the voice coil temperature. This insures that the frequency response does not change until the thermal excursion limit has been met. At this point, the limiter will engage to keep the driver in a Safe Operating Area (SOA).

The nonlinear modeling system may accurately model the dynamic behavior of loudspeakers with functions that have been curve fit for a range corresponding to a safe operating zone, as well as properties outside of the safe operating zone. This model creates more constrained and stable functions to drive the loudspeaker at all levels.

FIG. 1 illustrates an example speaker system 10 including an audio source 12 that is configured to transmit an audio signal to an amplifier 14 and a loudspeaker 18. One or more controllers, hereinafter the "controller 16" may be in communication with the amplifier 14. The controller 16 may be generally coupled to memory for operation of instructions to execute equations and methods described herein. In general, the controller 16 is programmed to execute the various methods as noted herein. The controller 16 may include the models described herein. The controller 16 may modify an audio signal based on the temperature and nonlinearities of the loudspeaker. The loudspeaker 18 may include one or more drivers including a horn driver (or high frequency (HF) driver) and/or woofer to reproduce the audio signal. The drivers included and described herein are exemplary and not intended to be limiting. Other drivers may be included having various frequency ranges. The loudspeaker 18 may include a cone and a voice coil.

The loudspeaker 18 may include a magnet, a back plate, a top plate, a pole piece 125, and a voice coil. The voice coil may comprise of a wire such as an insulated copper wire 130 (i.e., voice coil or coil) wound on a coil former. The voice coil may be centered with a magnetic gap. The voice coil may be configured to receive a signal from the amplifier 14. This signal may create an electrical current within the voice coil. The magnetic field in the magnetic gap may interact with the current carrying voice coil thereby generating a force. The resulting force may cause the voice coil to move back and forth and consequently displacing the cone from its rest position. The motion of a speaker cone 150 moves the air in front of the cone, creating sound waves, thus acoustically reproducing the electrical signal.

The loudspeaker 18 may include a magnet, a back plate, a top plate, a pole piece, and a voice coil. The voice coil may comprise of a wire such as an insulated copper wire (i.e., voice coil or coil) wound on a coil former. The voice coil may be centered with a magnetic gap. The voice coil may be configured to receive a signal from the amplifier 14. This signal may create an electrical current within the voice coil. The magnetic field in the magnetic gap may interact with the current carrying voice coil thereby generating a force. The resulting force may cause the voice coil to move back and forth and consequently displacing the cone from its rest position. The motion of a speaker cone moves the air in front of the cone, creating sound waves, thus acoustically reproducing the electrical signal.

The loudspeaker 18 includes the speaker cone (or diaphragm) extending radially outward from the coil creating a conical or dome-like shape. The center of the cone near the voice coil may be held in place by a spider. The spider and surround together generally allow only for axial movement of the speaker cone. During operation, and while the electrical current is being driven through the coil, the coil may move axially causing movement of the cone (i.e., cone excursion). The cone excursion or displacement x, in general, is the distance that the cone moves from a rest position. The distance from the rest position varies as the magnitude of the electric signal supplied to the coil changes. For example, the coil, upon receiving an electronic signal with a large voltage, may cause the coil to move out of or further into the magnetic gap. When the coil moves in and out of the magnetic gap, the cone may be displaced from the cone's rest position. Thus, a large voltage may create a large cone excursion which in turn causes the nonlinearities inherent in the transducer to become dominant.

As the excursion or displacement of the cone x increases, the surround and spider may become progressively stiffer. Due to the increasing stiffness Kms, more force, and consequently larger input power may be required to further increase the excursion of the cone. Furthermore, as the cone moves into the enclosure, the air inside the box may be compressed and may act as a spring thereby increasing the total stiffness $K_{ms}(x)$. Thus, the displacement dependent total stiffness $K_{ms}(x)$ of the loudspeaker 18 may comprise of the stiffness of the spider, the surround, and the air.

Figure 2:
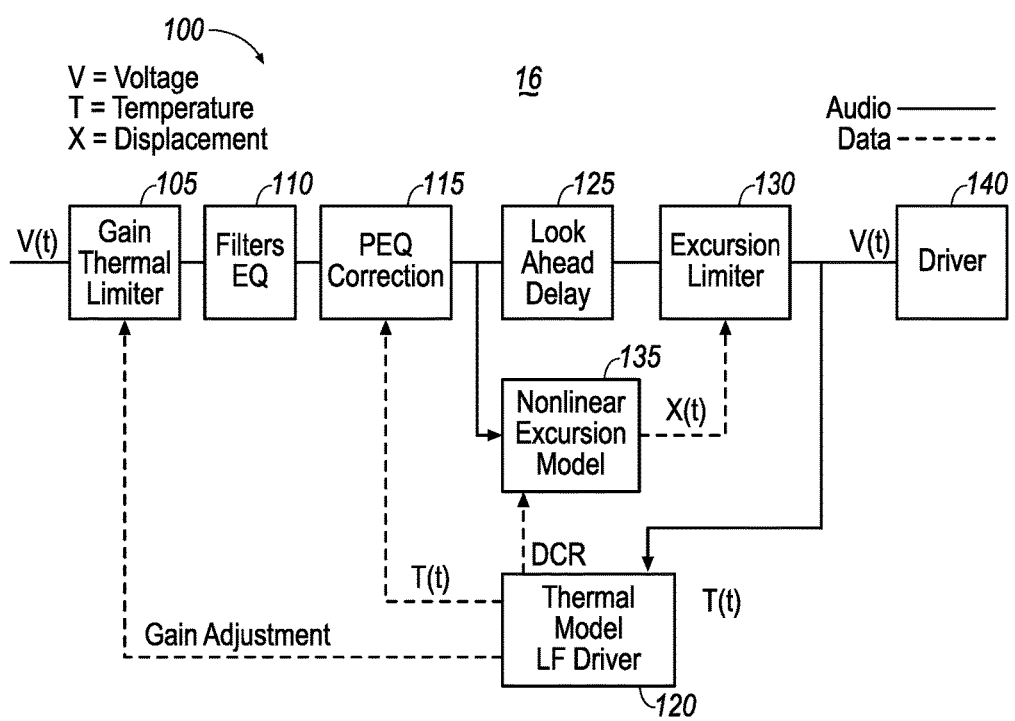
FIG. 2 illustrates an example system for loudspeaker state variable/parameter prediction.

FIG. 2 illustrates an example system 100 for loudspeaker parameter prediction. The system 100 may be configured to receive an audio signal, predict various thermal model characteristics and apply certain equalization parameters to the audio signal, and supply the audio signal to a driver. The system 100 may include a gain thermal limiter 105. The gain thermal limiter 105 may be a limiter configured to apply a gain adjustment from a thermal model 120. The thermal model 120 may determine frequency dependent thermal parameters, as well as frequency independent thermal parameters, and apply such parameters to increase sound quality and protect speakers from thermal overload. The thermal model 120 is described in more detail below with respect to FIGS. 4-10.

An equalization block 110 may apply equalization parameters to the audio signal via various filters. The equalization parameters may include various amplitudes for specific frequencies to be applied to the audio signal. A parametric equalization block 115 may apply a second order filter function and adjust the equalization of the audio signal. The parametric equalization block 115 may receive a temperature T from the thermal model 120.

The system 100 may include a look ahead delay 125 configured to accommodate certain delays with respect to the audio signal and computational requirements. An excursion limiter 130 may receive a displacement signal X(t) from a nonlinear excursion model 135. The excursion limiter 130 may constrain functions so that the functions are stable at all drive levels. These functions may be defined by the nonlinear excursion model 135, which is discussed in more detail below with respect to FIGS. 11-21.

The driver 140 may receive the audio signal from the excursion limiter 130 and convert the electrical signal to sound waves. The driver 140 may be a transducer such as a mid-range driver, tweeter or woofer. The driver 140 may have a specific heat tolerance at which the quality of the sound waves significantly decreases or fails at this tolerance during thermal overload.

Figure 3A:
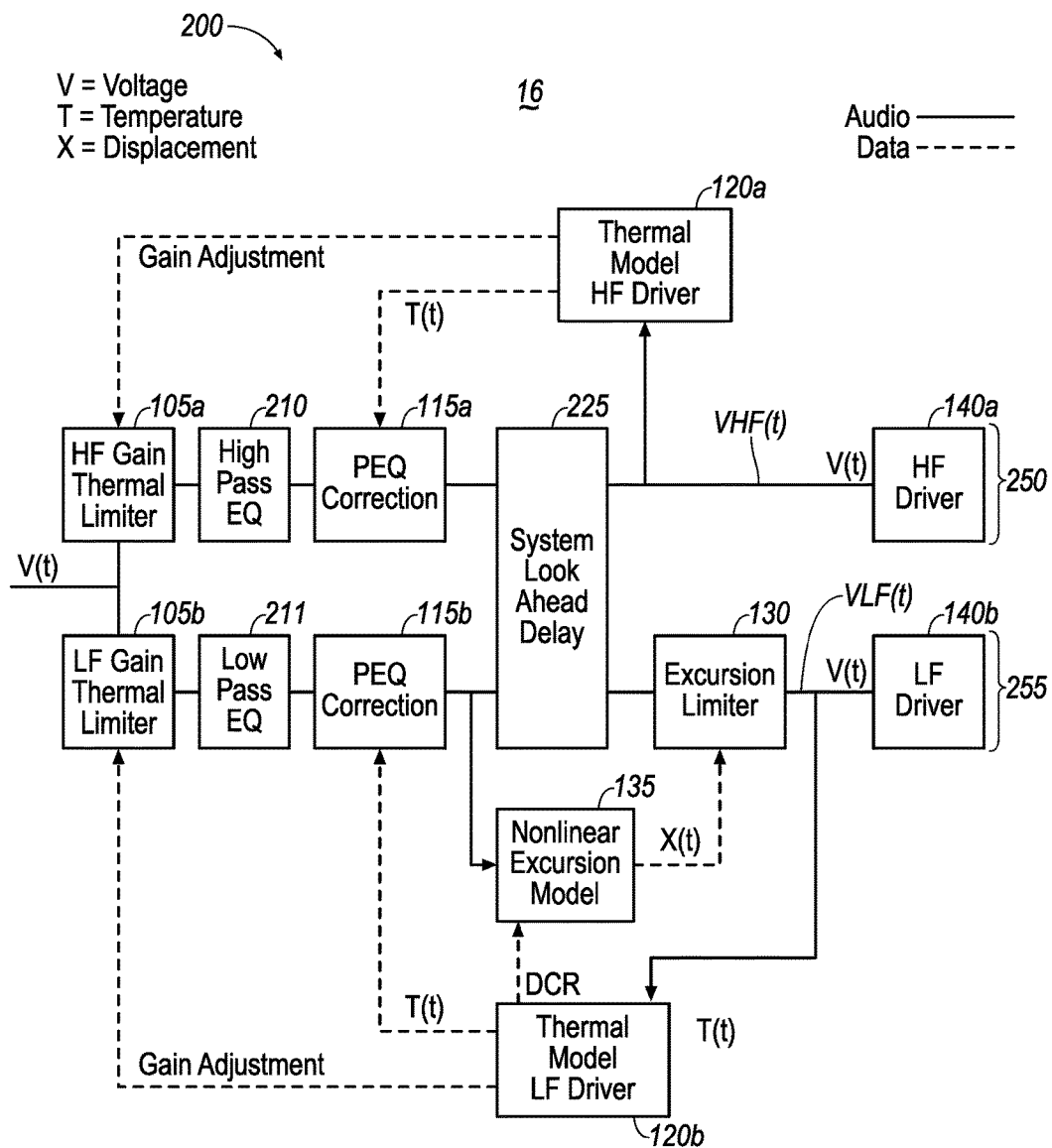
FIG. 3A illustrates an example system for loudspeaker state variable/parameter prediction in a noncoupled two-way system.

FIG. 3A illustrates an example system 200 for loudspeaker parameter prediction in a noncoupled two-way system. In this example, multiple channels, or frequency bands are included, specifically a high frequency channel 250 and a low frequency channel 255. The excursion limiter 130 is applied at the low frequency channel 255 in this example.

The system 200 may include a high frequency thermal limiter 105*a* and a thermal model high frequency 120*a* at the high frequency channel 250, and a low frequency thermal limiter 105*b* and a thermal model low frequency 120*b* at the low frequency channel 255. Each of the limiters 105*a*, 105*b* may receive the audio signal V(t) and a gain adjustment from the respective thermal model 120*a*, 120*b*. As explained above with respect to FIG. 2, the thermal model drivers 120*a*, 120*b* may determine frequency dependent thermal parameters, as well as frequency independent thermal parameters, and apply such parameters to increase sound quality and protect speakers from thermal overload. The thermal model drivers 120*a*, 120*b*, are described in more detail below with respect to FIGS. 4-10.

A high pass equalization block 110*a* and a low pass equalization block 110*b* may receive the audio signal from the respective thermal limiters 105*a*, 105*b* and apply equalization parameter apply equalization parameters to the audio signal via various filters. The equalization parameters may include various amplitudes for specific frequencies to be applied to the audio signal. Parametric equalization blocks 115*a*, 115*b* may apply a second order filter function and adjust the Q of the audio signal. The parametric equalization blocks 115*a*, 115*b* may receive the temperature T from the respective thermal model 120.

The system 200 may include a look ahead delay 225 configured to accommodate certain delays with respect to the audio signal. The look ahead delay 225 may receive the filtered audio signals from the parametric equalization blocks 115*a*, 115*b*.

Similar to FIG. 2, the excursion limiter 130 may receive the displacement signal X(t) from a nonlinear excursion model 135. The excursion limiter 130 may constrain functions so that the functions are stable at all drive levels. These functions may be defined by the nonlinear excursion model 135, which is discussed in more detail below with respect to FIGS. 11-21. In the example of FIG. 3A, the excursion limiter 130 and the nonlinear excursion model 135 may be at the low frequency channel 255. In this example, the parametric equalization at the parametric equalization blocks 115*a*, 115*b* and the limiting at the gain thermal limiters 105*a*, 105*b*, are performed concurrently or near concurrently to avoid oscillation of the audio signals $V_{HF}(t)$, $V_{LF}(t)V_{HF}(t)$. Further, the gain thermal limiters 105*a*, 105*b* may work on a frame rate having a long sample rate, for example, 0.10 seconds. The excursion limiter 130, on the other hand, may have a rate that varies from sample to sample. Thus, the gain thermal limiters 105*a*, 105*b* and the excursion limiter 130 may have very different sample rates to avoid oscillation.

A high frequency driver 140*a* at the high frequency channel 250 may receive the high frequency audio signal $V_{HF}(t)$. A low frequency driver 140*b* at the low frequency channel 255 may receive the low frequency audio signal $V_{LF}(t)$ from the excursion limiter 130 and convert the electrical signal to sound waves. The drivers 140*a*, 140*b* may be transducers such as a mid-range driver, tweeter or woofer.

Figure 3B:
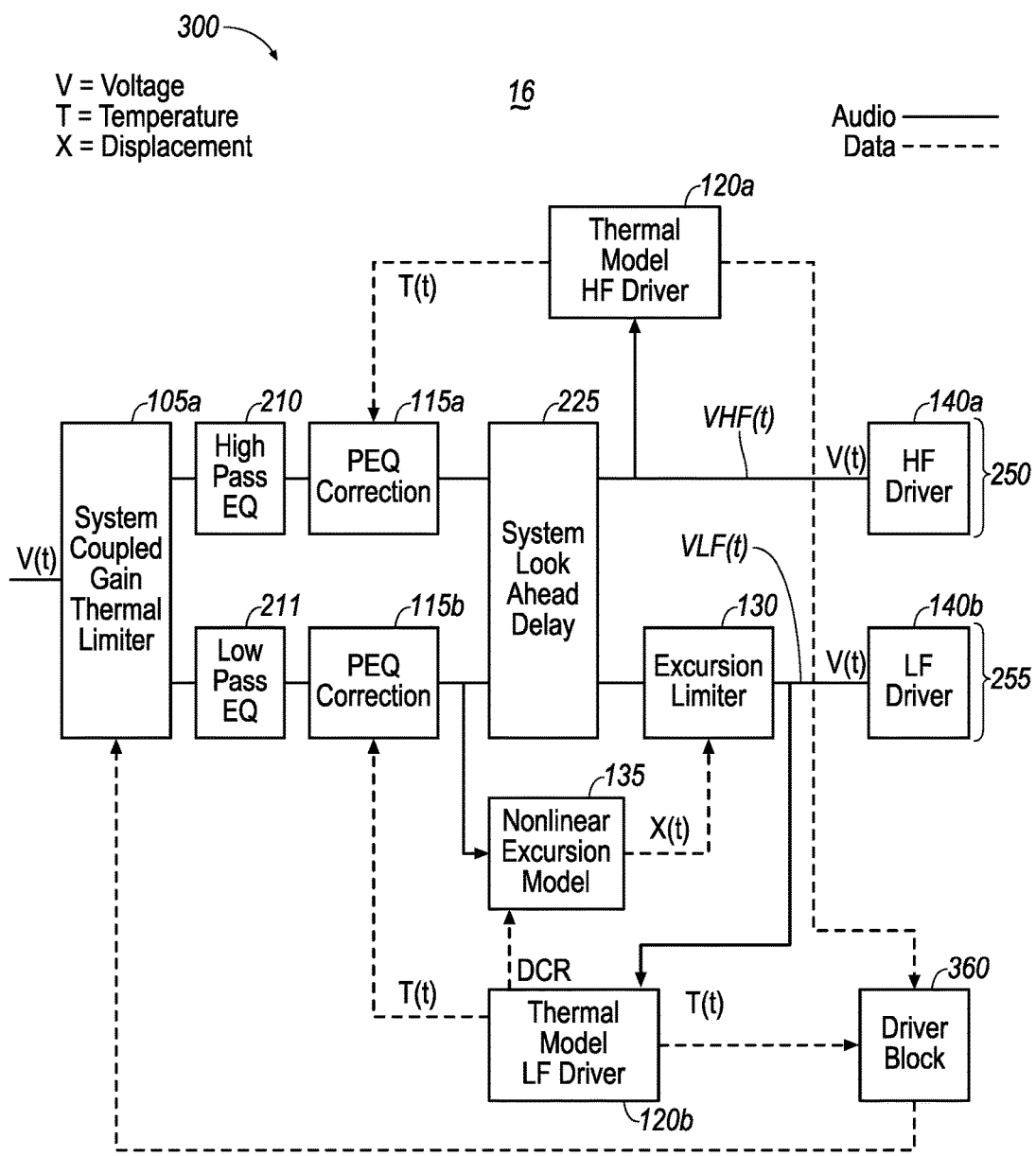
FIG. 3B illustrates an example system for loudspeaker state variable/parameter prediction in a coupled two-way system including an overall gain limiter.

FIG. 3B illustrates an example system 300 for loudspeaker real-time state variable prediction in a coupled two-way system where an overall gain limiter 305 is included. The overall gain limiter 305 may function similar to the gain thermal limiters, 105, 105*a*, 105*b*, but may be based on whichever driver reaches its thermal limit first. By implementing an overall limiter, the system 300 may realize a flat system response. That is, by protecting the weakest driver 140, system 300 may maintain a flat response. A driver block 360 may be configured to receive temperatures from each of the thermal model 120*a*, 120*b* and determine which of the driver 140 associated with the thermal model 120 is close to, or likely to reach, its thermal limit (e.g., heat tolerance). The driver block 360 may then provide the thermal parameters to the gain limiter 305 associated with that thermal model 120.

Similar to the system 200 of FIG. 3A, the excursion limiter 130 and the nonlinear excursion model 135 may be at the low frequency channel 255. In this example, the parametric equalization at the parametric equalization blocks 115*a*, 115*b* and the limiting at the gain thermal limiters 105*a*, 105*b*, are performed concurrently or near concurrently to avoid oscillation of the audio signals $V_{HF}(t)$, $V_{LF}(t)$. As explained above, the excursion limiter 130, on the other hand, may have a rate that varies from sample to sample. Thus, the gain thermal limiters 105*a*, 105*b* and the excursion limiter 130 may have very different sample rates to avoid oscillation Thus, the nonlinear excursion model 135 may provide a displacement signal x(t) to the excursion limiter 130 while the thermal model 120 may provide the voice coil temperature to the parametric equalization blocks and a gain adjustment to the gain thermal limiter 105. The displacement signal x(t) may include functions generated based on nonlinearities of the speakers. The frequency dependent thermal parameters may be used to estimate the coil temperature in order to prevent the system 100 from reaching its thermal limit.

The thermal model 120 may be configured to estimate input power from the audio signal V(t), as well as estimate the use of frequency dependent thermal parameters. When loudspeakers are played at a high volume for an extended period of time, the loudspeakers may heat up significantly. The resistance and impedance of the loudspeaker increases as the voice coil temperature increases. This may lead to power compression, including a loss in output of up to 6 decibels. Further, thermal overload caused by the overheating of the voice coil may damage or render the loudspeaker inoperable. Accurately predicting the voice coil temperature may solve these issues. Compensation for the power compression and adjustment of the frequency response may be achieved using linear parametric equalization (PEQ). Further, a temperature limiter protection level can be set such that a predetermined maximum temperature threshold will not be exceeded. Thus, the sound quality of the loudspeaker may be enhanced via power compression compensation, as well as the loudspeaker being protected from thermal overload, increasing its lifespan.

The improved accuracy of the temperature prediction is due, at least in part, by the use of frequency dependent thermal parameters for the voice coil and the magnets of the transducer. The value of the input power may be determined from the input voltage alone. By monitoring the input power, the system 100 may switch between frequency dependent heating modes and frequency independent cooling modes.

Figure 4:
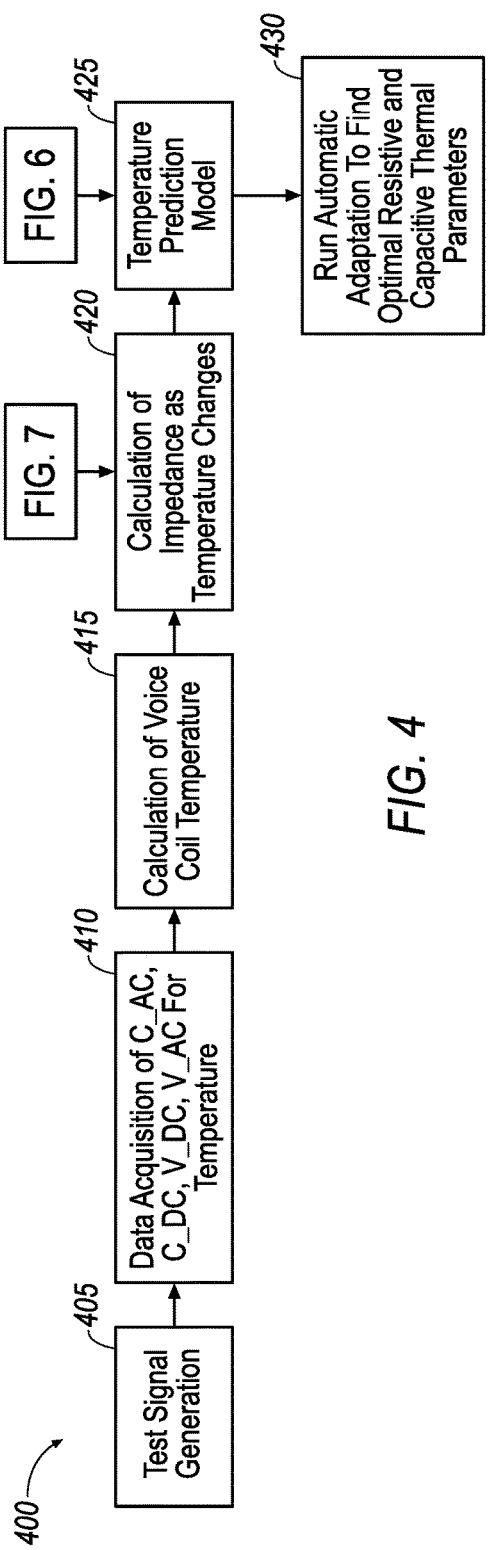
FIG. 4 illustrates an example thermal characterization system.

FIG. 4 illustrates an example thermal characterization system 400. The thermal characterization system 400 may be used to program the thermal model 120. The thermal characterization system 400 may include a test signal generation block 405.

At the test signal generation block 405, the measurement system 120 may generate a test signal. The test signal may be generated to capture a time constant of the magnet. The test signal may be generated based on a tonal test sequence and a pink noise test sequence. Typically, the test signal is generated over a 2-hour period to capture the magnet time constant.

The thermal characterization system 400 may include a data acquisition block 410 where various forms of data are received by the measurement system 120. Such data may include AC voltage, DC voltage, AC current and DC current. These four data outputs are acquired from the measurement circuit shown in FIG. 5. From these four outputs all necessary thermal characteristics for the speaker under test may be computed, including voice coil temperature and DC resistance (DCR).

A voice coil temperature block 415 may determine the voice coil temperature based on the DCR. The voice coil temperature may be determined by a temperature circuit 500, as shown in FIG. 5.

Figure 5:
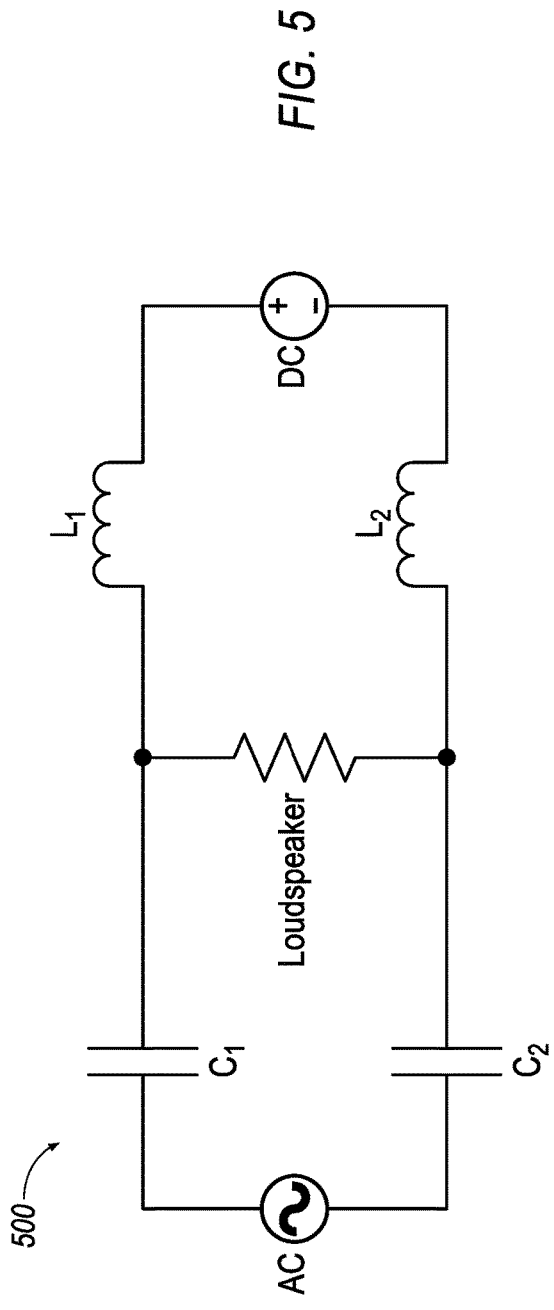
FIG. 5 illustrates a temperature measurement circuit.

FIG. 5 illustrates the temperature circuit 500, which may include an AC supply and a DC supply. The temperature circuit 500 may also include first and second inductors $L_1$ and $L_2$ which prevent AC current from flowing back into the DC supply. Capacitors $C_1$ and $C_2$ may prevent DC current from flowing back into the AC supply. The actual temperature may be determined based on the DC resistance calculated based on measurements of DC voltage and DC current. (AC current and voltage will later be used to compute impedance as a function of temperature and true power.

The temperature circuit 500 may measure four channels of data as well as the near field measured by a microphone or laser displacement. Thus, five channels may be acquired. Channel 1 may include the AC current, which is high pass filtered to pass frequencies above 10 Hz. Channel 2 may be the DC current, which is the main factor used for temperature calculation. This current may be low pass filtered to pass frequencies below 10 Hz. Channel 3 may be the DC voltage, which is low pass filtered to pass frequencies below 10 Hz.

This voltage is typically constant, such as 1V woofers, for example. Channel 4 may be the microphone pressure signal. Channel 5 may be the AC voltage, which is high pass filtered at 10 Hz. Further:

DCR=DC voltage/DC current=$V\_DC/C\_DC$, where DCR of the test circuit.

$R\_driver=V\_AC$(dc or low pass component)/$C\_DC$, where the V_AC is the AC voltage channel before stimulus is applied at the beginning of the test.

ActualTemp($n$)=[($V\_DC/C\_DC(n)$)−(DCR−$R\_driver$)− $R\_driver$)*((1/TCR)/$R\_driver$)], TCR=thermal coefficient of resistivity of the voice coil conductor.

where:

V_DC is the mean of channel 3-DC Voltage, measured at the beginning of the file (with the device cold), C_DC is the mean of channel 2 at the beginning of the file.

The temperature circuit 500 measures a DC coupled current signal and a model temperature is computed using the known resistance of the wire and the measured DC impedance value for the driver.

Figure 6:
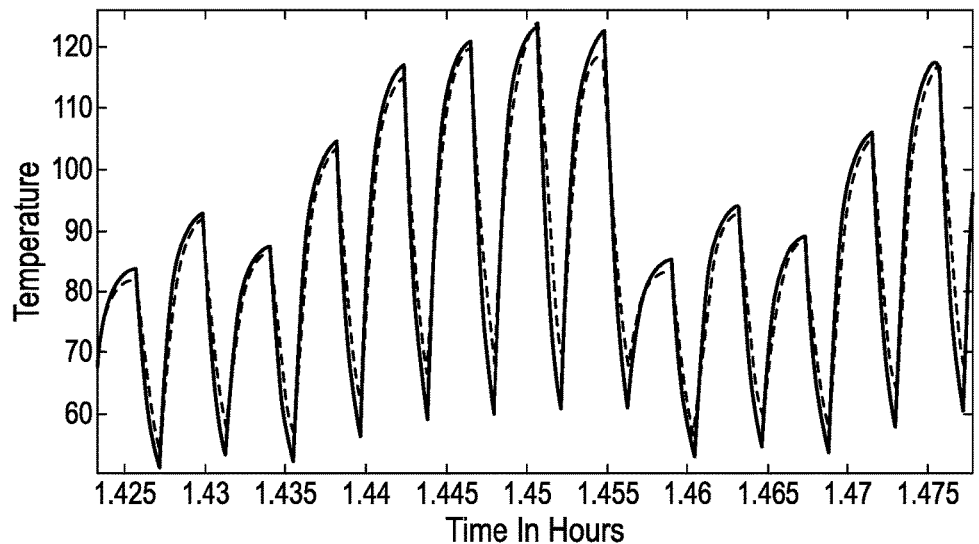
FIG. 6 illustrates an example chart showing actual measured temperature vs. model temperature.

FIG. 6 illustrates an example chart showing actual measured temperature (e.g., ActualTemp) vs. model temperature. In this example, the temperature of the voice coil is plotted over time for a tonal pulse sequence (e.g., the test signal) at low frequencies. In this example, the test was run for approximately 180 minutes. The normalized error between the actual measured temperature and the model temperature is 3.3%.

Returning to FIG. 4, an impedance block 420 may determine the impedance of the voice coil as a function of frequency and temperature and/or voltage level. This may be determined for both the HF drivers and the woofers. The temperature circuit 500 may determine an impedance curve as a function of temperature. This impedance curve allows for accurate estimates of heat power (Q) from $V^2/Z$, where Z is the impedance calculated from the predicted temperature rise. A test using the test signal generated in test signal generation block 405 may be processed and analyzed to create the impedance curves.

In order to determine the impedance as a function of temperature, the actual temperature equation from above is converted C_DC into temperature:

ActualTemp($n$)=[($V\_DC/C\_DC(n)$)−(DCR−$R\_driver$)− $R\_driver$)*((1/TCR)/$R\_driver$)]

Next, a Fast Fourier Transform (FFT) may be applied to the V_AC and C_AC to compute the impedance. The FFT may be applied to sweep test signals. Additionally or alternatively, pink noise sections instead of sweeps may be used. A wide-band source should be in the test signal in order to generate the impedance curve. The impedance curve may show how the impedance changes with temperature as well as a cold impedance of the loudspeaker. The cold impedance may be the impedance at the start of measurement when the speaker is at an ambient room temperature Verification that the lowest frequency bin of the FFT of the impedance curves matches the DCR values, may be accomplished by taking the mean of channel 3 over the mean of channel 2:

$$DCR = \frac{|V\_DC|}{|C\_DC|}$$

Figure 7:
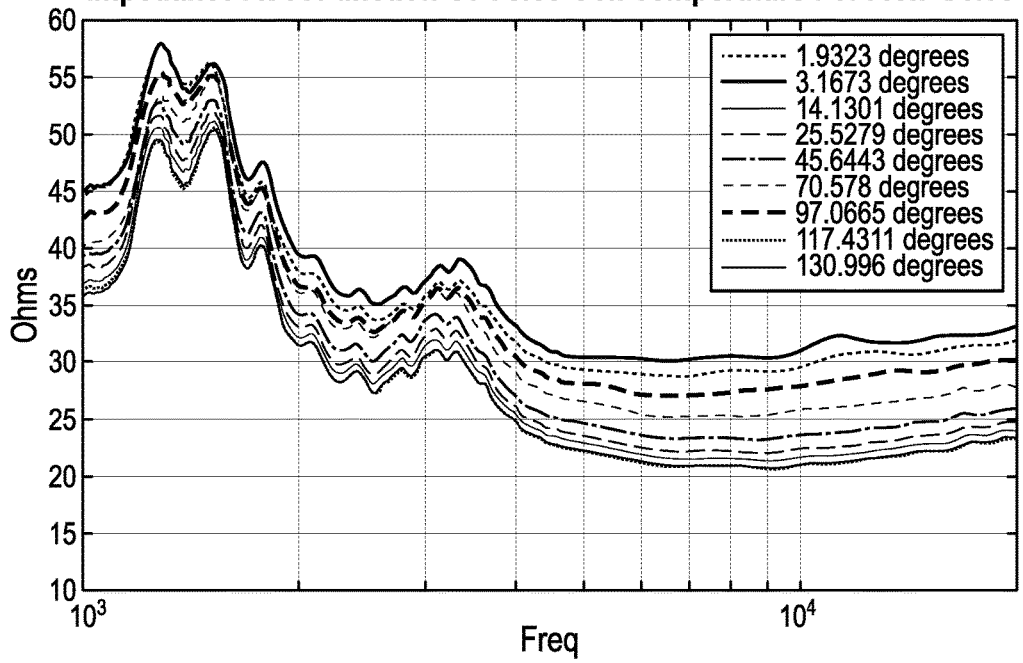
FIG. 7 illustrates an example chart showing impedance as a function of voice coil temperature for the horn or HF driver.

FIG. 7 illustrates an example chart showing impedance as a function of voice coil temperature for the HF driver. Notably, the impedance increases relatively constantly as the voice coil temperature increases. Thus, the impedance curve for HF driver is relatively predicable over temperature. The impedance curve as a function of temperature can accurately be modeled as the cold impedance plus a frequency independent offset based on temperature. The offset needed is found by referring to the impedance as a function of temperature data shown in FIG. 7.

Figure 8:
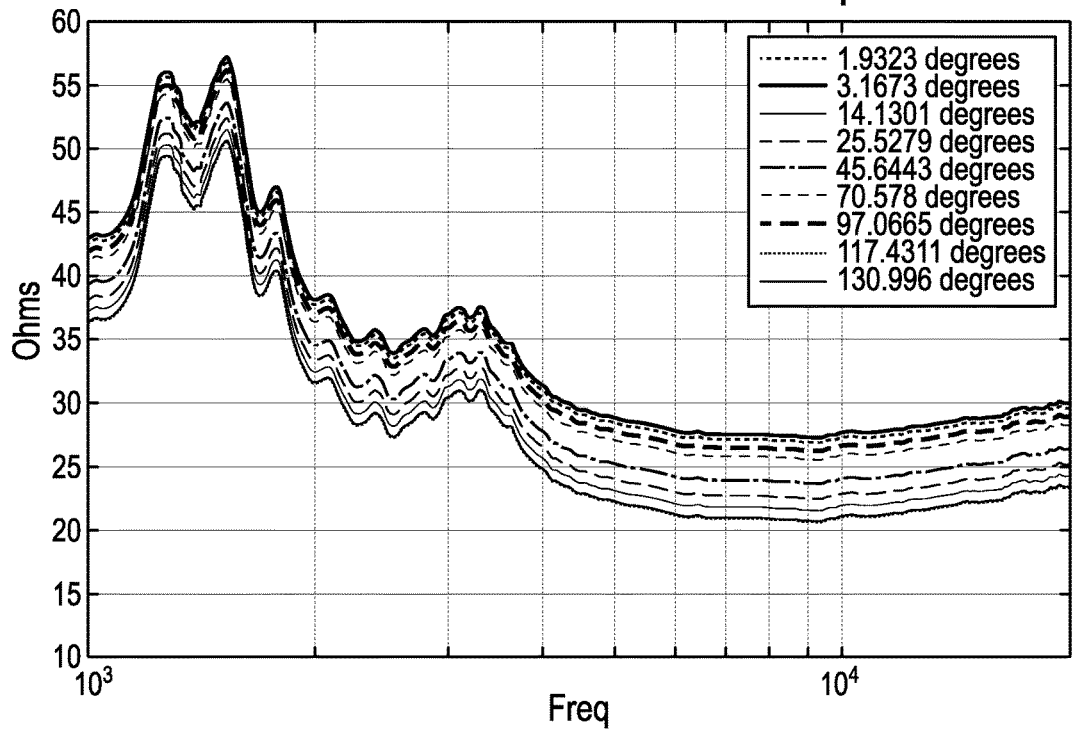
FIG. 8 illustrates an example chart showing impedance as a function of voice coil temperature when the offset is included.

FIG. 8 illustrates an example chart showing inductance $L_e$ as a function of voice coil temperature when the offset is included. By using cold impedance with a simple DC bias shift, the impedance closely corresponds to the true estimates.

Figure 9:
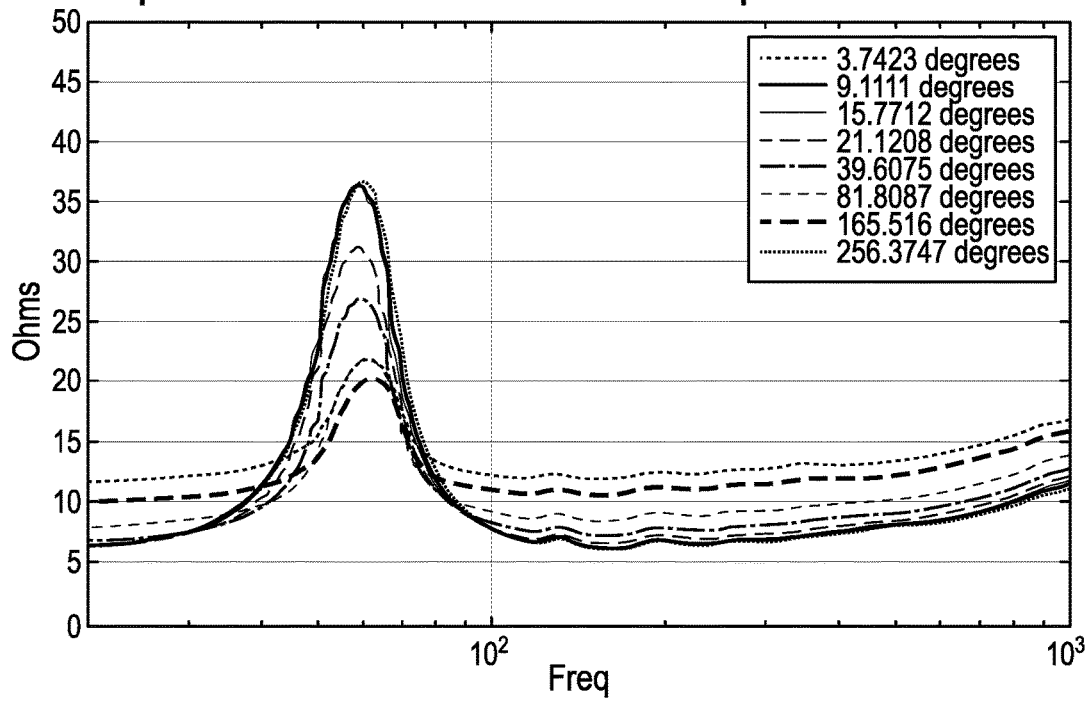
FIG. 9 illustrates an example chart showing impedance as a function of voice coil temperature for a closed-box woofer.

FIG. 9 illustrates an example chart showing impedance as a function of voice coil temperature for the woofer. The impedance in this example is simple and therefore can be modeled using the upper frequency regions as well as the resonance region of the plot.

The temperature prediction model 425 may determine the frequency dependent thermal parameters of the loudspeaker. This may be accomplished by iteratively processing the test signal to find the optimal parameters for the frequency dependent thermal modeling. While under power, heating is frequency dependent. While not under power, cooling is essentially frequency independent. Because of this, the temperature prediction model 425 may generate a set of first parameters that are frequency dependent for the voice coil and magnet. Once the speaker heats up and is shut off, the speaker may begin to cool. During cooling the parameters may be frequency independent. The temperature prediction model 425 may also generate a set of second parameters that are frequency independent. By using the first parameters during power, and the second parameters during no power, thermal model accuracy may be increased.

These parameters may be developed by the optimization analysis block 430. The optimization analysis block 430 may provide for real-time or near real-time modeling of the voice coil temperature for both HF drivers and woofers.

Figure 10:
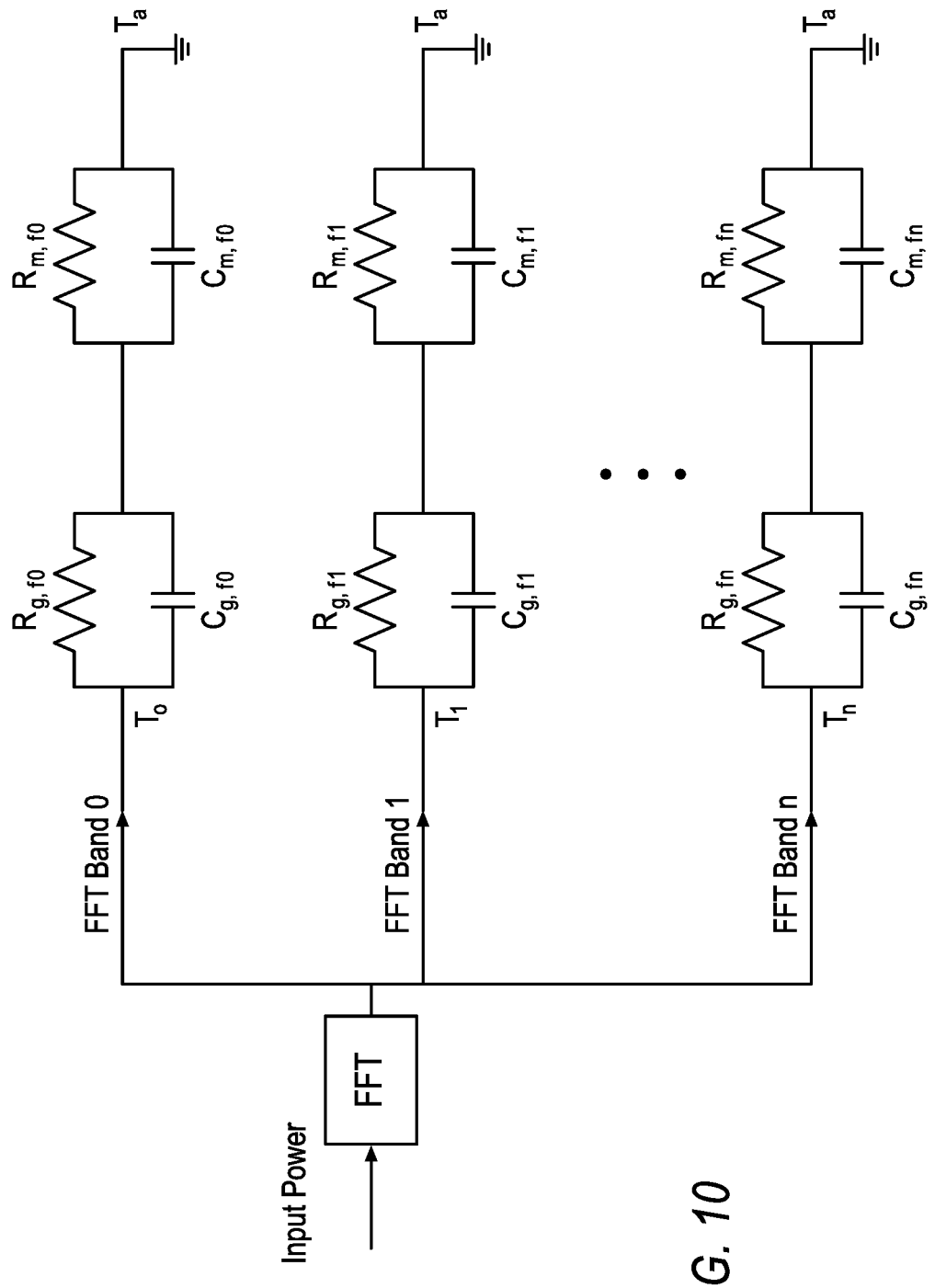
FIG. 10 illustrates an example frequency dependent thermal time constant model for temperature.

FIG. 10 illustrates an example frequency dependent thermal time constant model 1000 for temperature. The model 1000 may include an FFT 1005 configured to divide the audio signal V(t) into various frequency bands. In one example, the audio signal V(t) may be divided into twelve frequency bands. In another example, the audio signal V(t) may be divided into 24 bands, and so on. Once the audio signal V(t) is divided into multiple frequency bands, an RC circuit may be applied to each frequency band. In another example, the model 1000 may include other filters configured to divide the audio signal V(t) into the frequency bands.

As shown in FIG. 10, the model 1000 may include a first RC circuit 1010a, a second RC circuit 1010b, and continue to an $n^{th}$ RC circuit 1010n. For each RC circuit 1010, a resistor and capacitor may be included, one for each of the voice coil (g) and the magnet (m). The values of each of these components may produce frequency banded components of temperature. The sum of the values may be used to produce the total temperature. The values of the resistor and capacitor are determined by the optimization analysis 430, as outlined above.

For each frequency band, a heat power Q is estimate based on $V^2/Z$, where V is the input voltage in that band and Z is the impedance curve value adjusted by the most recent temperature estimated in the model. Since the impedance may shift as a function of the frequency, the power may be estimated based on the shifting impedance. Thus, voice coil temperature may be predicted using only the voltage sent to the speaker (e.g., the audio signal V(t)). The thermal model system and method disclosed herein eliminates the need for additional sensors.

During the operation of a loudspeaker, the current carrying voice coil may cause the speaker cone to move and be displaced from the cone's rest position. The movement of the speaker cone may cause air in front of the cone to move thereby producing sound waves. High voltages levels of the loudspeaker will exhibit non-linear behavior. Thus, large displacements of the speaker cone from the cone's rest position may alter the electromechanical properties of the loudspeaker substantially thereby producing nonlinear audio distortion. The nonlinear audio distortion may result in deterioration of the audio quality. Driving a speaker to very large displacements could cause permanent damage to the speaker. Knowledge of the displacement of the speaker cone may be used to prevent very large excursions (or displacements) from occurring, thus preserving speaker health as well as providing a safe way to play sound at maximum volume.

Current loudspeaker modeling, specifically nonlinear modeling, may use the Klippel method. This method may create polynomials which are curve-fit for a range of cone displacement values, e.g., a safe operating area (SOA). This method energizes the speaker with different signals and through displacement and current feedback estimates for the 'large signal' nonlinear parameters. In this method, the shape of the nonlinear component of BL (Force factor), $K_{ms}$ (stiffness), and $L_e$ (inductance of the coil), versus displacement, can be accurately measured. However, at displacements higher than those tested, the 'tails' of these functions which fall outside of the SOA, are not known. The reason these areas aren't tested is because it will often break or overheat the speaker. The Klippel method curve fits a $4^{th}$ to $8^{th}$ order polynomial to the measured data to estimate the nonlinear functions. While this works well for comparing designs or using modeling to estimate distortion within the measured boundaries, it loses accuracy outside these bounds and accurate modeling of over-drive conditions becomes highly inaccurate and unstable. That is, outside of the SOA, the polynomials may have properties that are inaccurate and lead to erroneous modeling. Such errors may cause an unstable model that may 'blow up' when over driven. This is important for modeling a system using a limiter due to the nature of the model being regularly overdriven.

Disclosed herein is a nonlinear excursion model 135 configured to define and constrain various functions so as to stabilize the model at all drive levels, even those outside of the SOA of the speaker. The nonlinear excursion model 135 may provide the displacement signal to the excursion limiter 130.

Referring back to FIGS. 2-3, the nonlinear excursion model 135 may include a processor configured to carry out the processes and methods described herein. In one example the processor may be controller 16 of FIG. 1. In other examples, the nonlinear excursion model 135 may include or use a special processor specific to developing the displacement signal x(t).

The dynamic nonlinear behavior of a loudspeaker can be calculated based on the following differential equations.

The 'voltage' lumped element equation for loudspeakers may be defined as:

$$U = R_e i + \frac{d(L_e(x)i)}{dx} + BL(x)x'$$

The 'force' lumped element equation may be defined as:

$$BL(x)i = Mmsx'' + Rmsx' - \frac{i^2}{2}\frac{dL_e(x)}{dx} + K_{ms}(x)x$$

The approximate discrete-time equations for current and displacement may be derived for implementation from these two standard lumped element equations:

$$i(n) = \left(U(n) - BL(x)x' - x'\frac{dL_e(x)}{dx}i(n-1) + \frac{Le(x)}{dt}i(n-1)\right) \bigg/ \left(R_e + \frac{Le(x)}{dt}\right) \quad \text{Current}$$

$$x(n+1) = \frac{\left(BL(x)i - Rmsx' - x(n)Kms(x) + \frac{i^2}{2}\frac{dLe(x)}{dx}\right)}{Mmsdt^2} + 2x(n) - x(n-1) \quad \text{Displacement}$$

Here $BL(x)$, $K_{ms}(x)$, $L_e(x)$, $$\frac{dL_e(x)}{dx}$$

are nonlinear functions of x, usually modeled as polynomial functions.

A standard polynomial equation may be represented as:

$$f(x) = p_1 x + p_2 x^2 + \ldots + p_N x^N$$

The parameters of $BL(x)$ or force factor function, $K_{ms}(x)$ or stiffness function, and $L_e(x)$ or inductance function, are nonlinear functions that may dictate the 'large signal' behavior. As can be seen from the above, in order to predict cone displacement, the function must be easily differentiable and convertible to a discreet time function.

As explained above, the Klippel method curve fits a $4^{th}$ to $8^{th}$ order polynomial to the measured data to estimate the nonlinear functions. While this works well for comparing designs or using modeling to estimate distortion within the measured boundaries such, known as a Safe Operating Area (SOA), these curve fits lose accuracy outside these bounds and accurate modeling of over-drive conditions becomes highly inaccurate and unstable.

Figure 11A:
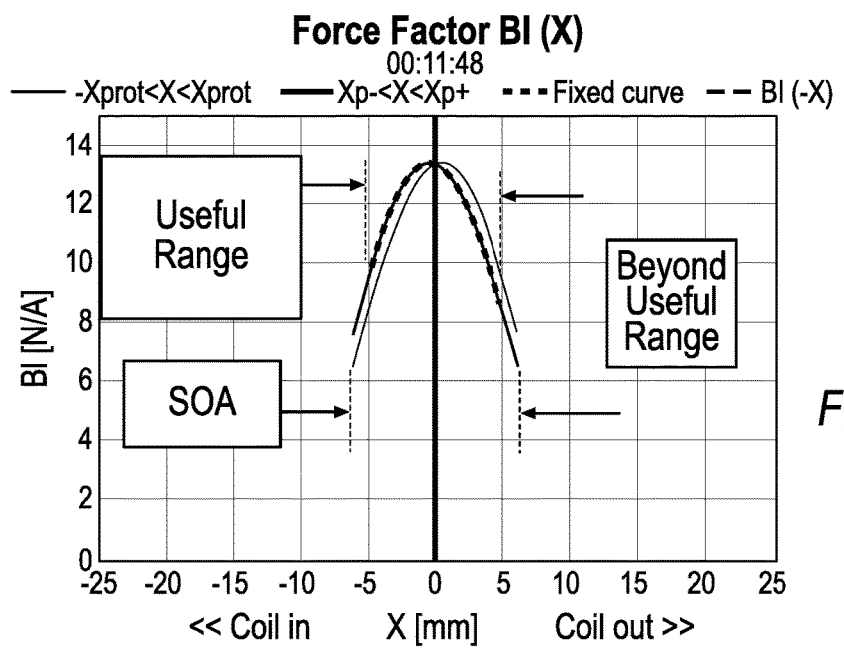
FIGS. 11A-11C illustrate example graphical representations of the polynomials as estimated for a portion of the nonlinear parameters for a typical loudspeaker as measured by the Klippel method.
Figure 11B:
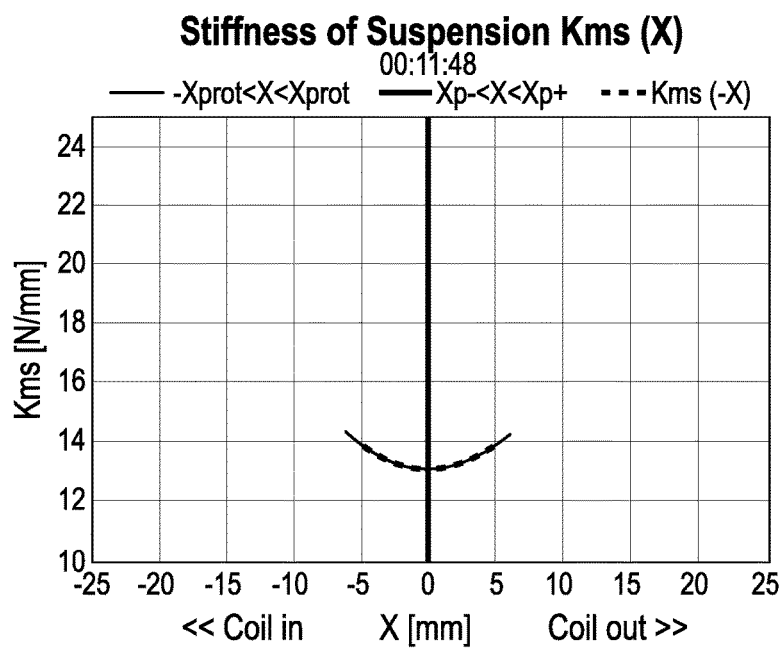
Figure 11C:
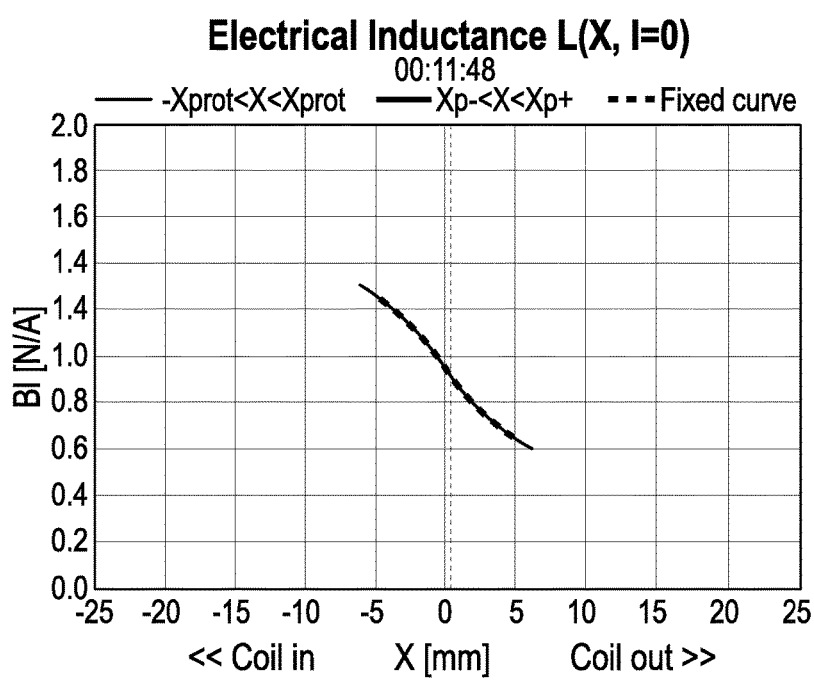

FIGS. 11A-11C are example graphical representations of the polynomials as estimated for a portion of the nonlinear parameters for a typical loudspeaker as measured by the Klippel method. Specifically, FIG. 11A illustrates an example graphical representation for the $BL(x)$ factor. FIG. 11B illustrates an example graphical representation for the $K_{ms}(x)$ factor. FIG. 11C illustrates an example graphical representation for the $L_e(x)$ factor.

The graphs show the section of the polynomial that was curve fit based on the maximum tested displacement in the SOA. If the BL curve shown in FIG. 11A is extended beyond the useful range and the SOA, the curve will go negative. Negative BL is not a physical possibility and reveals a flaw in the traditional modeling of BL via a polynomial.

Figure 12A:
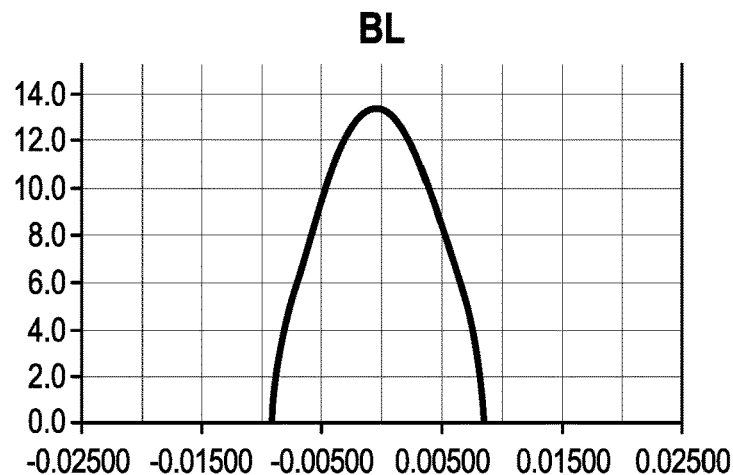
FIGS. 12A-12C illustrate example graphical representation of the polynomials expanded beyond the tested range.
Figure 12B:
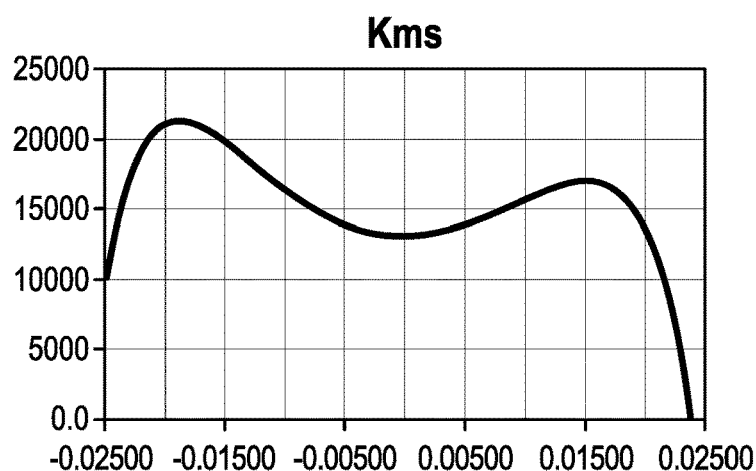
Figure 12C:
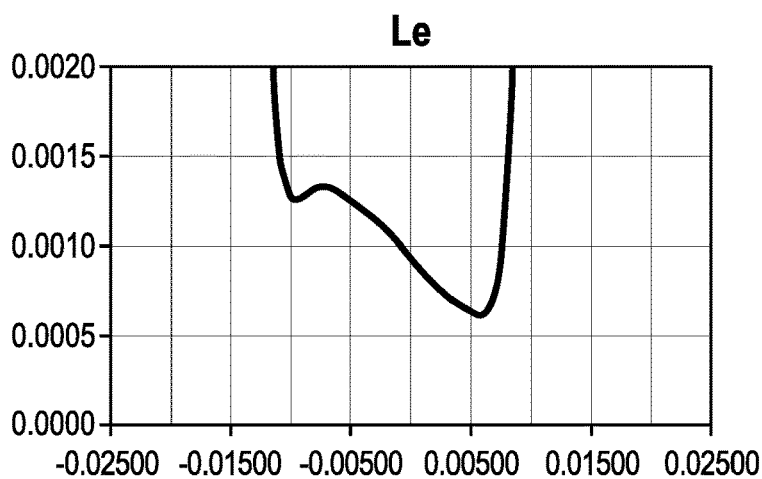

FIGS. 12A-12C illustrate example graphical representations of the polynomials expanded beyond the tested range. Specifically, FIG. 12A illustrates an example graphical representation for the $BL(x)$ function as modeled based on the Klippel method. As illustrated, the force factor BL quickly goes negative outside of the test range. A true force factor BL of a real speaker would not behave in this manner. FIG. 12B illustrates an example $K_{ms}(x)$ function. The stiffness $K_{ms}$ is shown to decrease at a high amplitude, though in practice the stiffness $K_{ms}$ would never be negative. FIG. 12C illustrates an example $L_e(x)$ function. The inductance $L_e$ is shown to jump dramatically at the ends, which would not be the case for a real speaker. As shown, these functions behave unrealistically outside of the SOA, especially the $BL(x)$ function. Because of this unrealistic modeling, the system will be unstable and 'blow up' when the function goes through zero. Any large or rapidly changing inductance values may also cause the model to be unstable.

Instead of the above referenced behavior, these functions should asymptote monotonically. The $BL(x)$ function should asymptote to zero and never go negative. The $K_{ms}(x)$ function should asymptote to infinity, or at least the fixed value should asymptote when the suspension tears. The $L_e(x)$ function should asymptote to the fixed value of inductance equivalent to the coil in free air in the outward direction and the inductance with the coil at the bottom of the gap in the inward direction.

For the $BL(x)$ function, a general Exponential or Gaussian mixture model equation may be appropriate for M kernels with sets of Gaussian fit parameters, in sets of three. For scale, sigma and mean may be used. Such equation may be represented by:

$$f(x) = \sum_{i=1}^{M} p_{1,i} e^{\frac{-(x-p_{3,i})^2}{2p_{2,i}^2}}$$

Where
$p_{1,i}$ = scale
$p_{2,i}$ = sigma (width)
$p_{3,i}$ = mean (offset)

An example Gaussian mixture model using 6 parameters $[p_{1,1}, p_{2,1}, p_{3,1}, p_{1,2}, p_{2,2}, p_{3,2}]$ and two Gaussian functions:

$$f(x) = \text{kernal } 1 + \text{kernal } 2$$

$$\text{kernal } 1 = p_{1,1} e^{\frac{-(x-p_{3,1})^2}{2p_{2,1}^2}}$$

$$\text{kernal } 2 = p_{1,2} e^{\frac{-(x-p_{3,2})^2}{2p_{2,2}^2}}$$

$$f(x) = p_{1,1} e^{\frac{-(x-p_{3,1})^2}{2p_{2,1}^2}} + p_{1,2} e^{\frac{-(x-p_{3,2})^2}{2p_{2,2}^2}}$$

Figure 13:
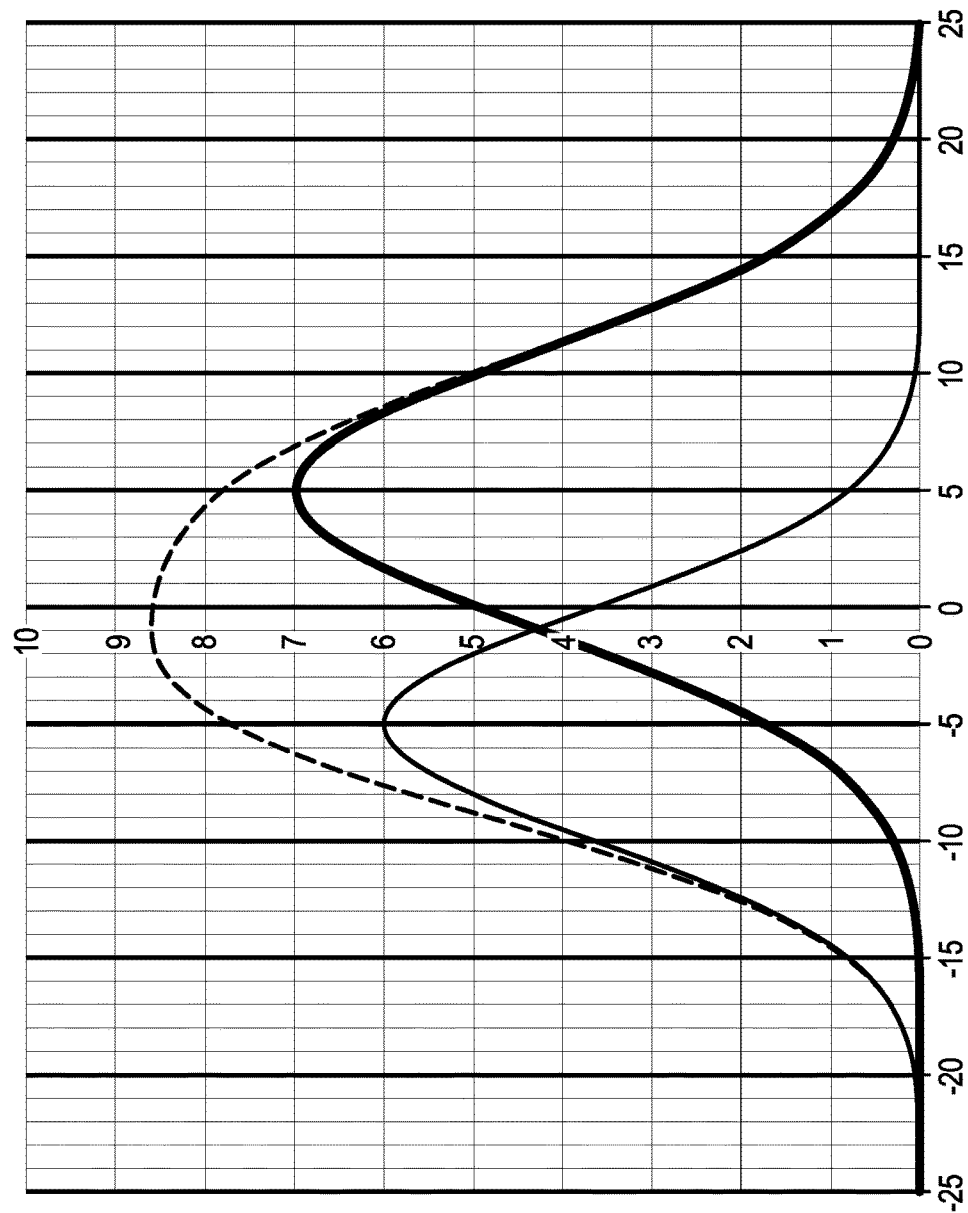
FIG. 13 illustrates an example graphical representation of the two Gaussian Kernals and a realistic $B_l(x)$ function.

FIG. 13 illustrates an example graphical representation of the two Gaussian Kernals and a realistic $BL(x)$ function.

Figure 14:
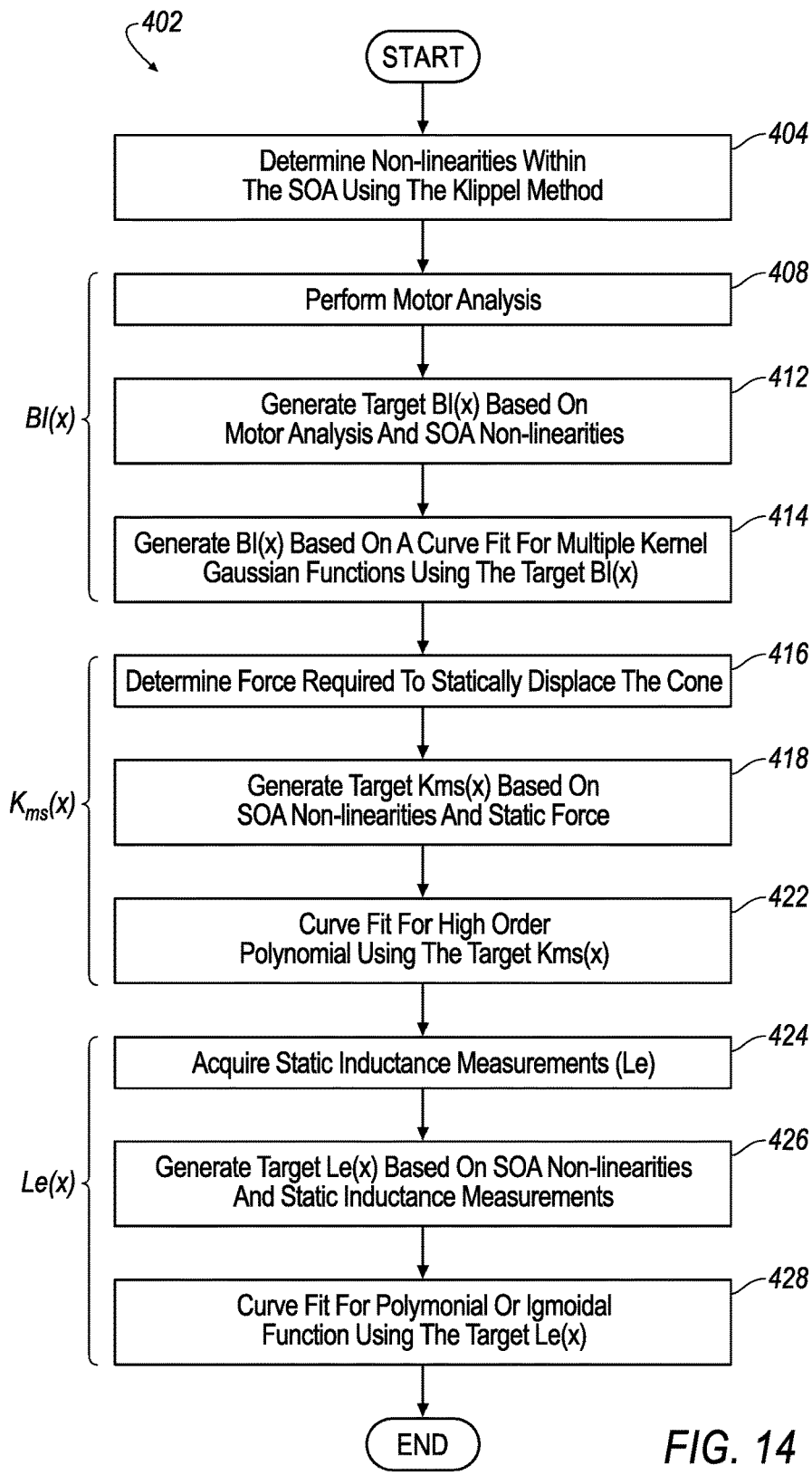
FIG. 14 illustrates an example flow chart for a process 402 for determining the $B_l(x)$, $K_{ms}(x)$, and $L_e(x)$ functions.

FIG. 14 illustrates an example flow chart for a process 402 for determining the $BL(x)$, $K_{ms}(x)$, and $L_e(x)$ functions. These functions are generally derived from the Klippel method, which establishes nonlinearities within the SOA and create a target function (i.e., SOA nonlinearity curve) based on other data to curve and extrapolate the Klippel measurements into an appropriate function. That is, the functions conform to the data in the known area of the curve to generate the unknown region outside of the SOA. These functions may be properly constrained using natural asymptotes.

The process 402 begins at block 404 where the controller 16 determines the speaker nonlinearities using the Klippel method. These speaker nonlinearities may form the SOA nonlinearity curve.

The process 402 may determine a function for each of the BL(x), $K_{ms}(x)$, and $L_e(x)$. Blocks 408-414 may be directed to generating the BL(x) function, blocks 416-422 may be directed to generating the $K_{ms}(x)$ function, and blocks 424-428 may be directed to generating the $L_e(x)$ function.

With respect to the BL(x) function, at block 408, the designer of the controller 16 may perform a motor analysis. The motor analysis may include a finite element analysis (FEA) of the speaker motor. The FEA may be based on known characteristics of the motor. In another example, the motor analysis may include spot measurements of flux density both inside and outside of the motor.

Figure 15:
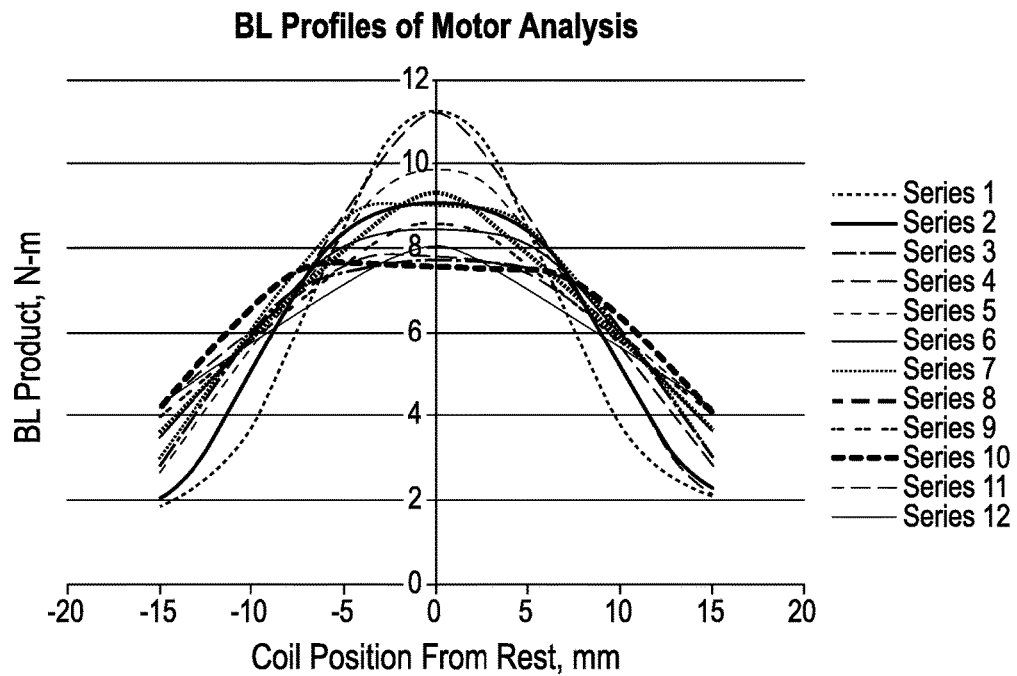
FIG. 15 illustrates an example graph showing various FEA simulations of an example speaker motors.

FIG. 15 illustrates an example graph showing various FEA simulations of example speaker motors.

Figure 16:
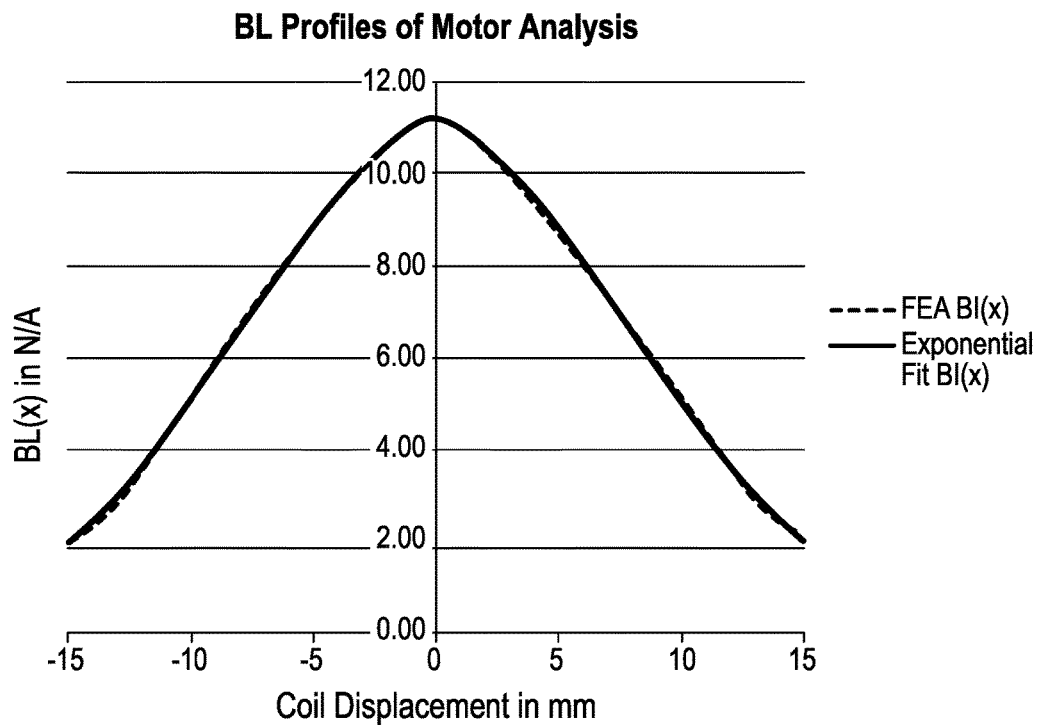
FIG. 16 illustrates an example graph of one of the FEA simulations for a specific speaker motor.

FIG. 16 illustrates an example graph of one of the FEA simulations for a specific speaker motor. This graph illustrates the typical tail of the simulations, which are provided based on the flux distribution of the motor and the coil topology. In these examples, the simulations mimic an exponential Gaussian function and may be a guide for creating the BL(x) function.

Returning to FIG. 14, at block 412, the controller 16 may be loaded with a target BL(x) function based on the motor analysis and SOA nonlinearity curve. The target BL(x) function may be the SOA nonlinearity curve with the tail characteristics generated by the motor analysis. The tail characteristics may be added tangent to the end of the SOA nonlinearity curve. The tail characteristics may illustrate likely behavior of the target BL(x) function outside of the SOA.

At block 414, the controller 16 may be loaded with aBL(x) by curve fitting an exponential function, such as a Kernel Gaussian function to the target BL(x) function (e.g., the SOA nonlinearity curve and the tail characteristics created by the motor analysis).

Figure 17:
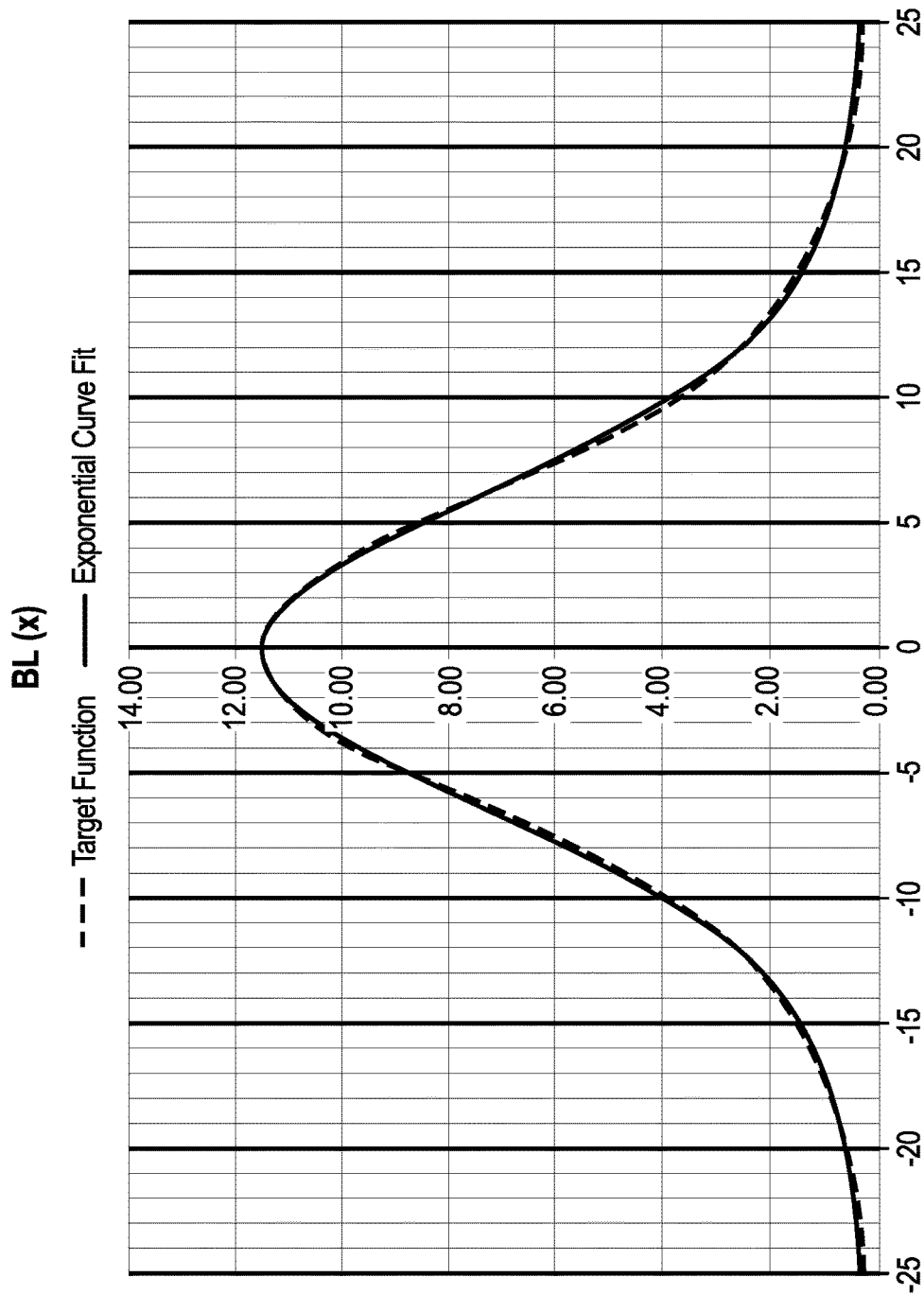
FIG. 17 illustrates a graph of an example $B_l(x)$ curve fit to the target $B_l(x)$.

FIG. 17 illustrates a graph of an example BL(x) curve fit to the target BL(x). As illustrated, an exponential function mimics the target BL(x) function, including the tails which are outside of the SOA.

With respect to $K_{ms}(x)$, at block 416, the designer of the controller 16 may determine a static force required to statically displace the speaker cone in both a forward and backward direction until the cone cannot displace any further without breaking. This maximum forcible displacement may indicate the asymptotes used to generate $K_{ms}(x)$.

At block 418, the controller 16 may be loaded with a target $K_{ms}(x)$ function based on the SOA nonlinearities and the static force. The target $K_{ms}(x)$ function may be generated by using the asymptotes created by the static force to generate an exponential curve. The inductance $L_e$ may be acquired via the spot measurements of flux density from the motor analysis of block 415.

Figure 18:
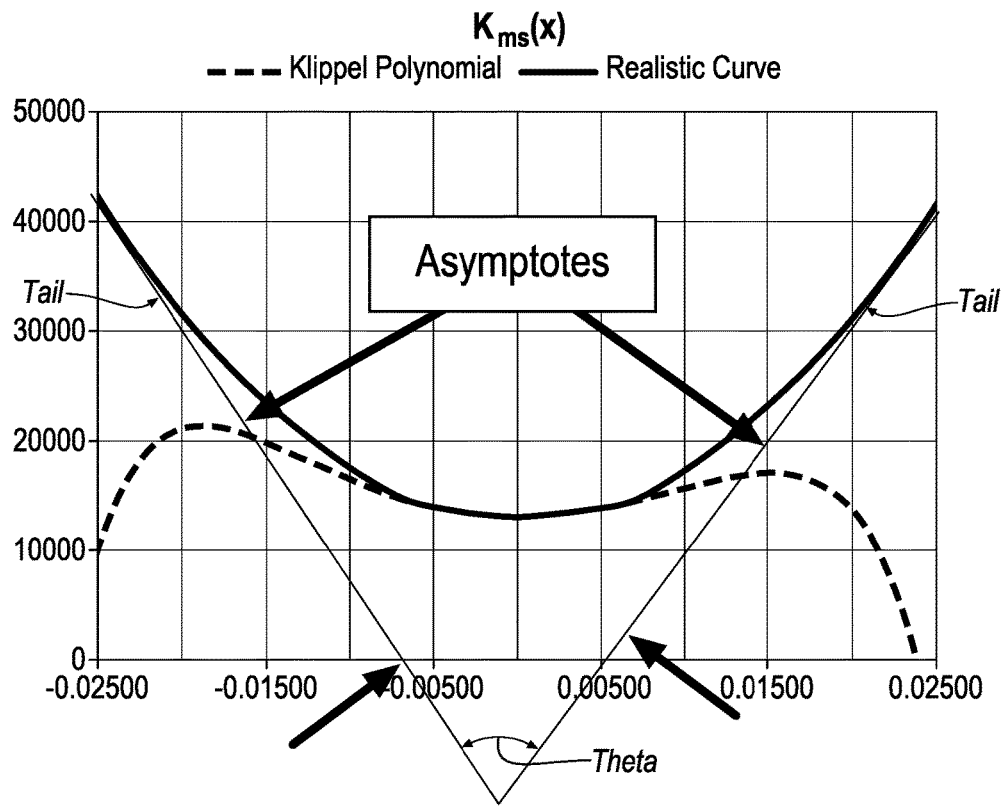
FIG. 18 illustrates an example graph of a target $K_{ms}(x)$ based on asymptotes generated from the static force.

FIG. 18 illustrates an example graph of a target $K_{ms}(x)$ function based on asymptotes generated from the static force. The apex of the target $K_{ms}(x)$ may align generally with the SOA nonlinearity curve. The tails of the target $K_{ms}(x)$ function may be formed based on the asymptotes, as shown in FIG. 18. As shown, the tails of the SOA nonlinearity curve decrease towards zero, which would not occur in the case of a real loudspeaker. To form an accurate target $K_{ms}(x)$ function, the asymptotes may be used to model the target $K_{ms}(x)$ function to a non-zero tail value.

As shown in FIG. 18, the asymptotes may form an apex and create a predefined angle, theta. Although theta is illustrated as being symmetrical, other nonsymmetrical thetas may be used. If the suspension will hard limit, then theta may approach zero and the asymptotes may be vertical. Regardless, a polynomial may be an appropriate function so long as the polynomial is constrained by the asymptotes.

Returning to FIG. 14, at block 422 the controller 16 may generate the $K_{ms}(x)$ function by curve fitting an exponential function to the target $K_{ms}(x)$ function (e.g., the SOA nonlinearity curve and the tail characteristics created by one or both of the static force or inductance).

Unlike the BL(x) function and the $K_{ms}(x)$ function, the $L_e(x)$ function may be generated using a four parameter generalized sigmoid function model:

$$f(x) = p_2 + \frac{p_1}{(1 + e^{-p_4(x-p_3)}) + p_1}$$

At block 424, the controller 16 may be loaded with static inductance values $L_e$.

At block 426, the controller 16 may be loaded with a target $L_e(x)$ function based on the static inductance $L_e$ outside of the SOA.

Figure 19:
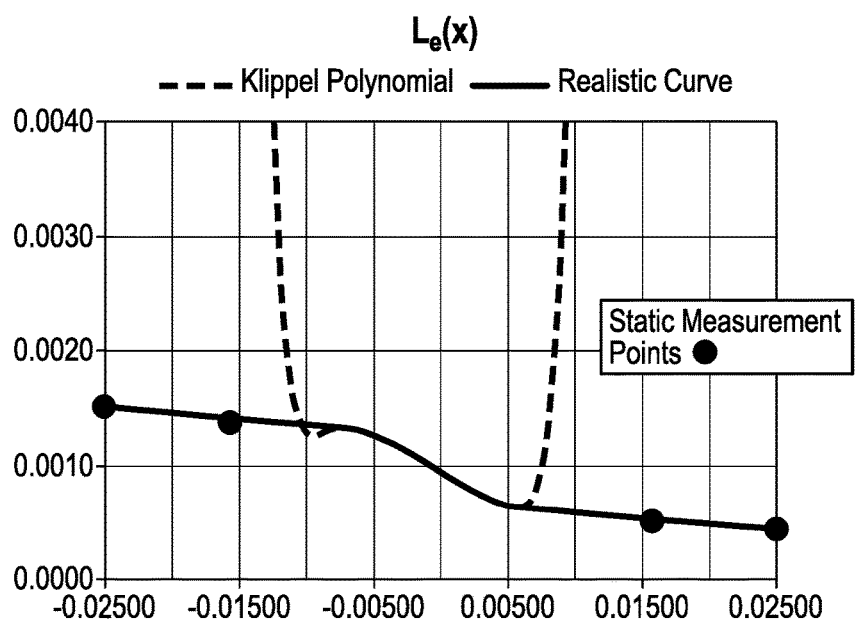
FIG. 19 illustrates an example graph of a target $K_{ms}(x)$ based on asymptotes spot measured inductance values $L_e$.

FIG. 19 illustrates an example graph of a target $L_e(x)$ function based on asymptotes based on spot measured inductance values $L_e$. The inductance $L_e$ may set limits in the outward direction to establish a target $L_e(x)$ function. As shown in FIG. 19, the target $L_e(x)$ function aligns at the outer edges with the inductance values $L_e$ and aligns within the SOA with the SOA nonlinearity curve.

Figure 20:
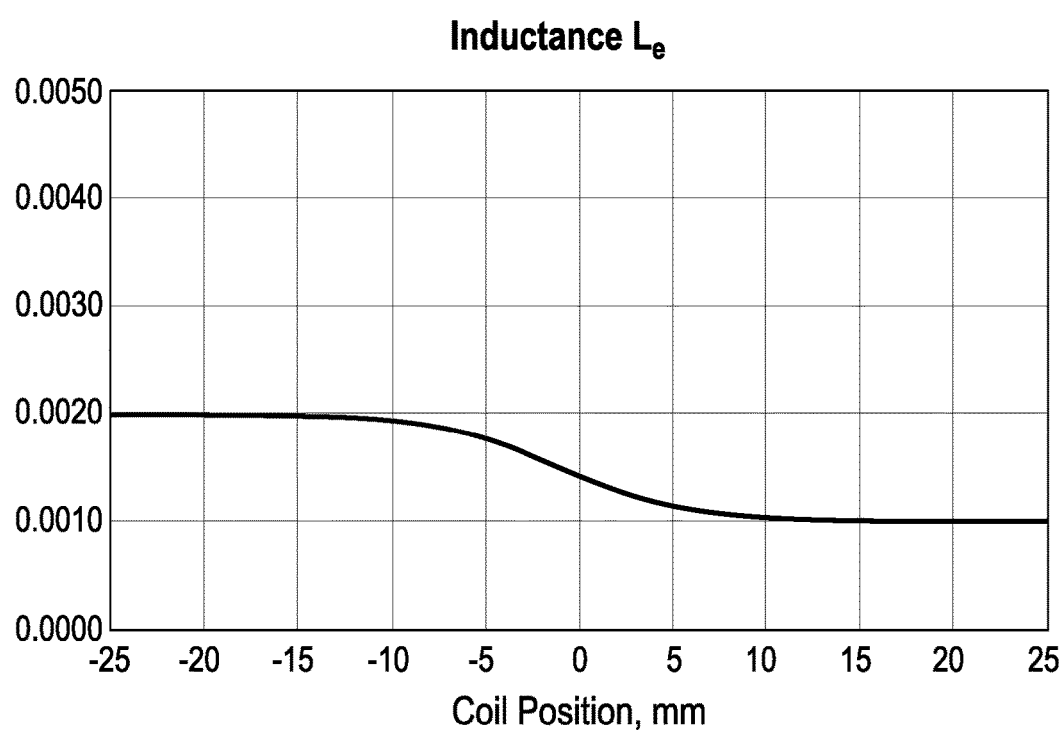
FIG. 20 illustrates an example graph of a target $L_e(x)$.

FIG. 20 illustrates an example graph of a target $L_e(x)$ function. As shown, the target $L_e(x)$ function may mimic a sigmoid function.

Returning to FIG. 14, at block 428, the $L_e(x)$ may be generated by curve fitting a sigmoid function to the target $L_e(x)$ function.

The process 402 then ends.

While FIG. 14 is focused on the above three nonlinearities of loudspeakers, these should not be considered as the only possible application of the idea. The basic nonlinear parameter estimation process explained herein could and should be used for any loudspeaker nonlinearity.

Figure 21A:
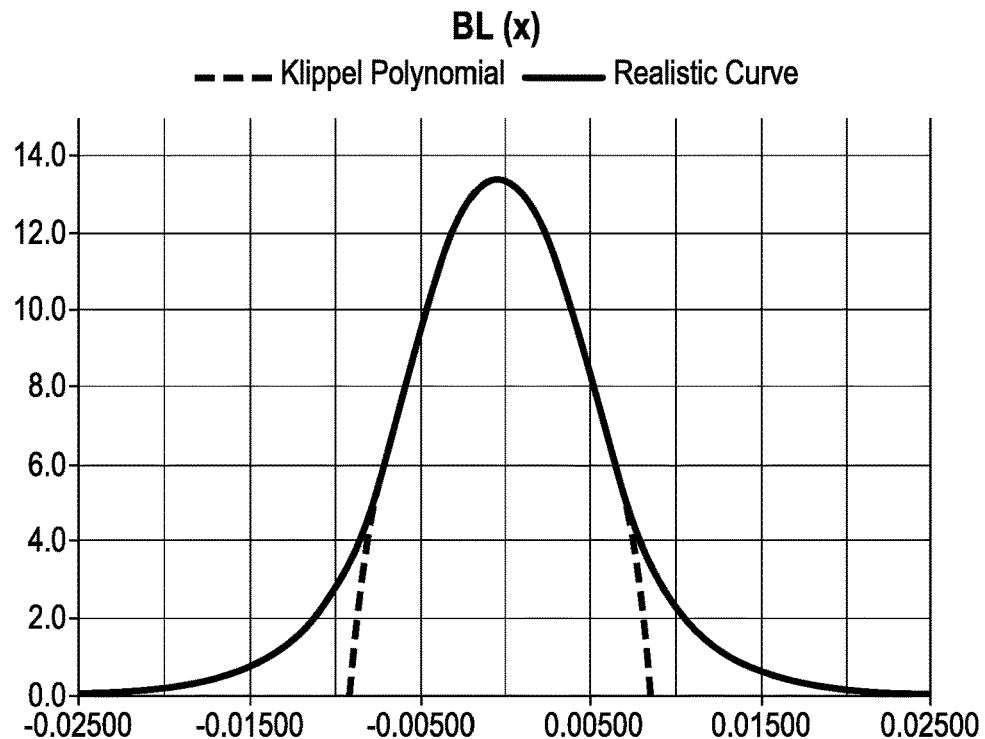
FIGS. 21A-C illustrate example graphs showing the SOA nonlinearity curves and the modeled curves.
Figure 21B:
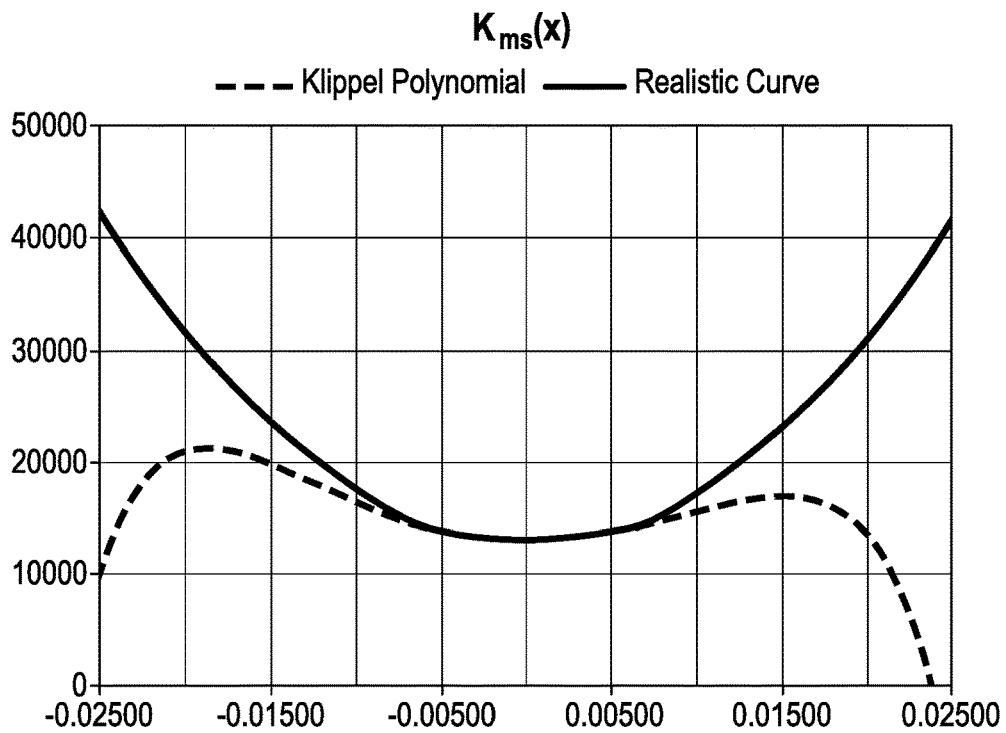
Figure 21C:
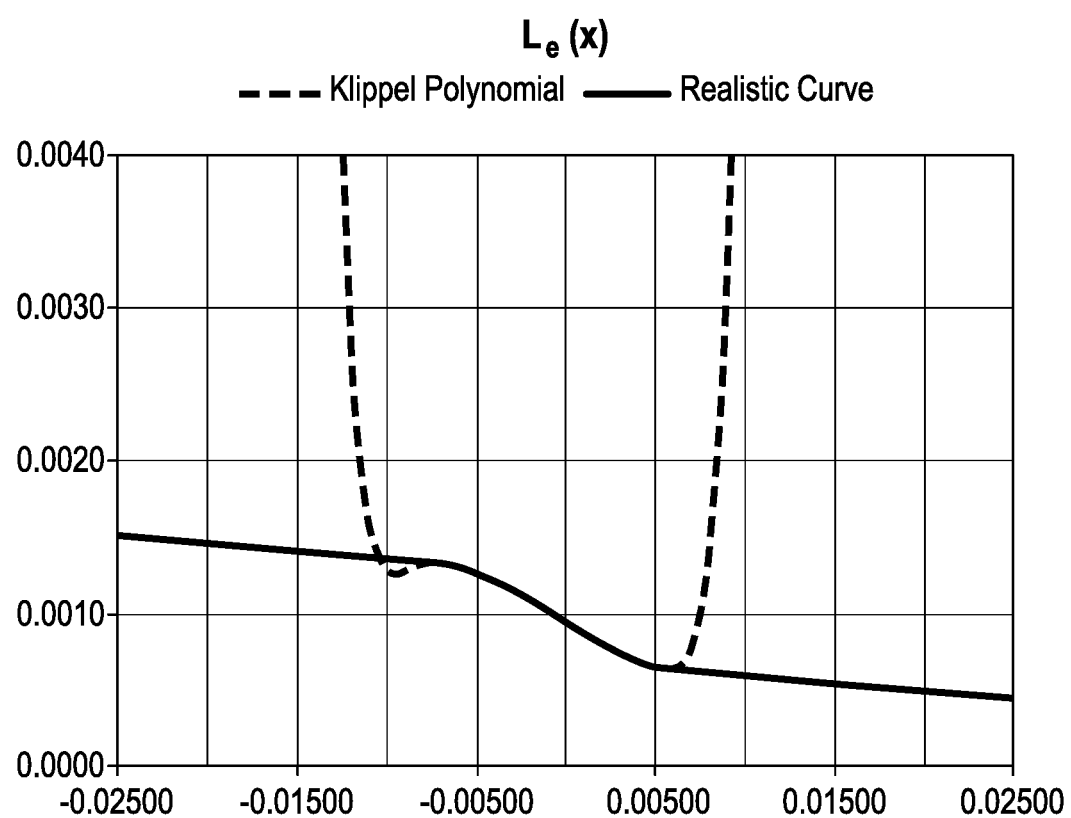

FIGS. 21A-C illustrate example graphs showing the SOA nonlinearity curves and the modeled curves (e.g., nonlinear functions BL(x), $K_{ms}(x)$, and $L_e(x)$. FIG. 21A illustrates an example BL(x), FIG. 21B illustrates an Example $K_{ms}(x)$, and FIG. 21C illustrates an example $L_e(x)$. As shown, the modeled curves illustrate a more realistic function and align with practical experience in view of the realistic behavior outside of the SOA.

Computing devices described herein generally include computer-executable instructions, where the instructions may be executable by one or more computing or hardware devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A loudspeaker parameter prediction system, comprising:
   a loudspeaker having a driver and a diaphragm;
   a non-linear excursion model configured to estimate non-linear excursion of the loudspeaker;
   an excursion limiter configured to receive a displacement calculation from the non-linear excursion model;
   a thermal model configured to:
      utilize frequency dependent parameters based on at least one thermal property of the loudspeaker;
      receive the displacement calculation from the excursion limiter to determine real-time temperature of the loudspeaker and impedance;
   and
   a gain adjustment thermal limiter configured to apply a gain reduction to an incoming audio signal based on the real-time temperature of the loudspeaker to protect the loudspeaker from thermal and excursion overload,
   wherein the gain adjustment thermal limiter includes a high frequency channel having a high frequency gain limiter and a low frequency channel having a low frequency gain limiter,
   wherein the thermal model includes a high frequency driver configured to provide high frequency parameters to the high frequency gain limiter, and a low frequency driver configured to provide low frequency parameters to the low frequency gain limiter.

2. The system of claim 1, further comprising an equalization block configured to receive the incoming audio signal from the gain adjustment thermal limiter and apply equalization parameters to the incoming audio signal.

3. The system of claim 1, further comprising a parameters equalization block configured to apply a second order filter function based on a temperature received from the thermal model.

4. The system of claim 1, wherein the non-linear excursion model is configured to determine the displacement calculation by:
   determining a safe operating area (SOA) nonlinearity curve of the loudspeaker;
   generating a target function based on the SOA nonlinearity curve; and
   apply a polynomial function to the target function to generate the displacement calculation.

5. The system of claim 4, wherein the displacement calculation includes at least one non-linear function.

6. The system of claim 1, wherein the gain adjustment thermal limiter applies the frequency dependent parameters during heating of a voice coil and frequency independent parameters during cooling of the voice coil.

7. A loudspeaker real-time state variable prediction system, comprising:
   a loudspeaker having a voice coil and a magnet;
   a non-linear excursion model configured to estimate a non-linear excursion of the loudspeaker;
   a thermal model configured to utilize thermal parameters that are frequency dependent based on at least one thermal property of the loudspeaker, wherein the thermal model includes a high frequency channel having a high frequency gain limiter and a low frequency channel having a low frequency gain limiter; and
   a gain adjustment thermal limiter configured to apply a gain reduction to an incoming audio signal to protect the loudspeaker from overload, wherein the gain adjustment thermal limiter includes a high frequency driver configured to provide high frequency parameters to the high frequency gain limiter, and a low frequency driver configured to provide low frequency parameters to the low frequency gain limiter.

8. The system of claim 7, further comprising an excursion limiter configured to receive a displacement calculation from the non-linear excursion model.

9. The system of claim 8, wherein the non-linear excursion model is configured to determine the displacement calculation by:
   determining a safe operating area (SOA) nonlinearity curve of the loudspeaker;
   generating a target function based on the SOA nonlinearity curve; and
   applying a curved polynomial to the target function to generate the displacement calculation.

10. The system of claim 8, wherein the displacement calculation includes at least one non-linear function.

11. The system of claim 7, further comprising, an equalization block configured to receive the incoming audio signal from the gain adjustment thermal limiter and apply equalization parameters to the incoming audio signal.

12. The system of claim 7, further comprising a parameters equalization block configured to apply a second order filter function based on a real-time temperature of the loudspeaker received from the thermal model.

13. The system of claim 7, wherein the gain adjustment thermal limiter applies the frequency dependent thermal parameters during heating of the voice coil and frequency independent parameters during cooling of the voice coil.

* * * * *